(12) United States Patent
Ito

(10) Patent No.: US 6,504,752 B2
(45) Date of Patent: Jan. 7, 2003

(54) MAGNETIC RANDOM ACCESS MEMORY

(75) Inventor: Hiroshi Ito, Yokohama (JP)

(73) Assignee: Kakbushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/987,980

(22) Filed: Nov. 16, 2001

(65) Prior Publication Data

US 2002/0080644 A1 Jun. 27, 2002

(30) Foreign Application Priority Data

Dec. 26, 2000 (JP) ........................... 2000-395723

(51) Int. Cl.$^7$ ................... G11C 11/00; G11C 11/14
(52) U.S. Cl. ................ 365/158; 365/171; 365/173
(58) Field of Search ................... 365/158, 171, 365/173

(56) References Cited

U.S. PATENT DOCUMENTS 5,699,293 A * 12/1997 Tehrani et al. ............... 365/158
5,793,697 A    8/1998 Scheuerlein ................ 365/171
6,191,972 B1 * 2/2001 Miura et al. ................ 365/158
6,341,084 B2 * 1/2002 Numata et al. ............. 365/171

OTHER PUBLICATIONS

R. Scheuerlein, et al., "A 10ns Read and Write Non–Volatile Memory Array Using a Magnetic Tunnel Junction and FET Switch in each Cell", 2000 IEEE International Solid–State Circuits Conference, pp. 128–129.

M. Dulam, et al., "Nonvolatile RAM based on Magnetic Tunnel Junction Elements", 2000 IEEE International Solid–State Circuits Conference, pp. 130–131.

* cited by examiner

Primary Examiner—Trong Phan

(57) ABSTRACT

A bias voltage generating circuit includes a series circuit of a magneto-resistance element and a MOS transistor. The MR ratio of the magneto-resistance element in the series circuit is set to ½ the MR ratio of the magneto-resistance element in a memory cell. An adjusting resistor has a resistance value ½ the interconnection resistance of a bit line. A bias voltage generating circuit applies a bias voltage to a sense current source. When a constant current flows in the bias voltage generating circuit, the sense current source supplies a sense current equal to the constant current to a bit line.

25 Claims, 12 Drawing Sheets

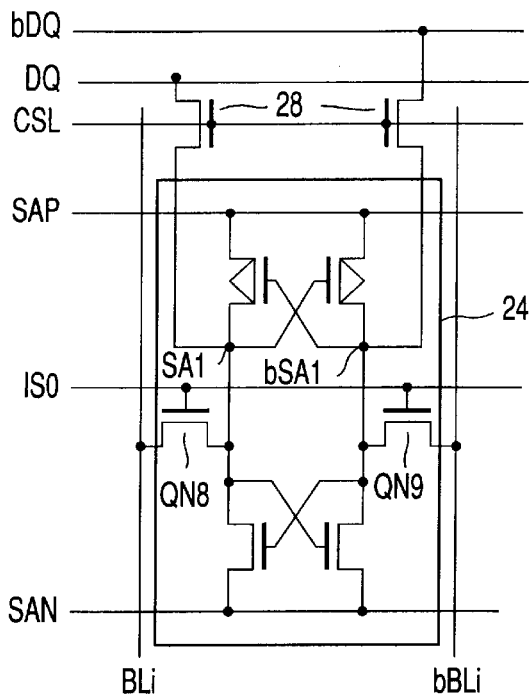
F I G. 8
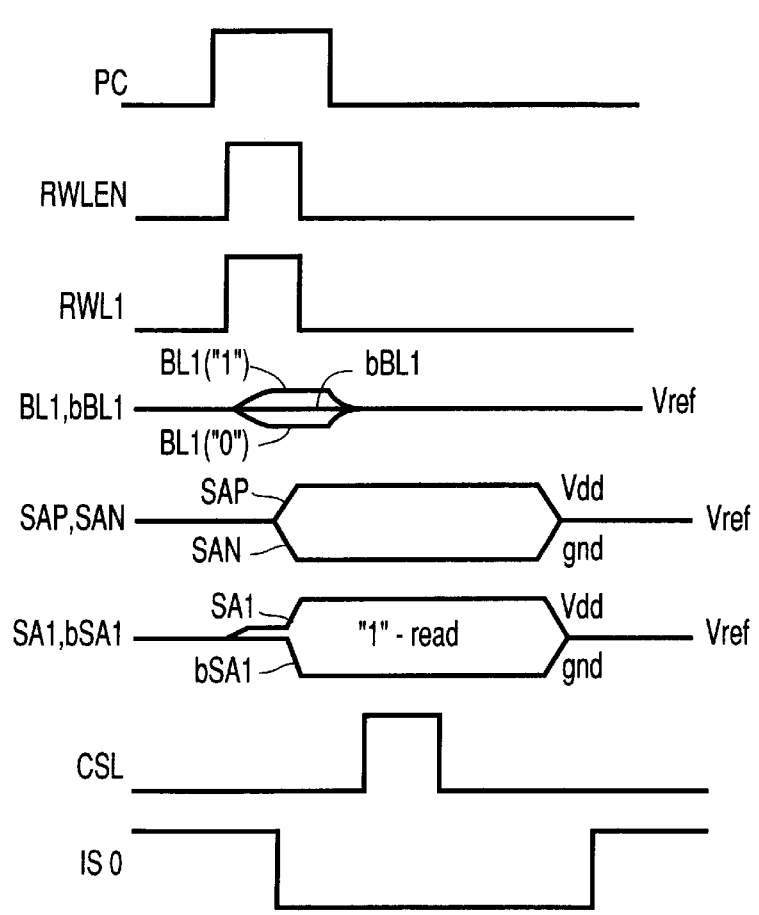
F I G. 9

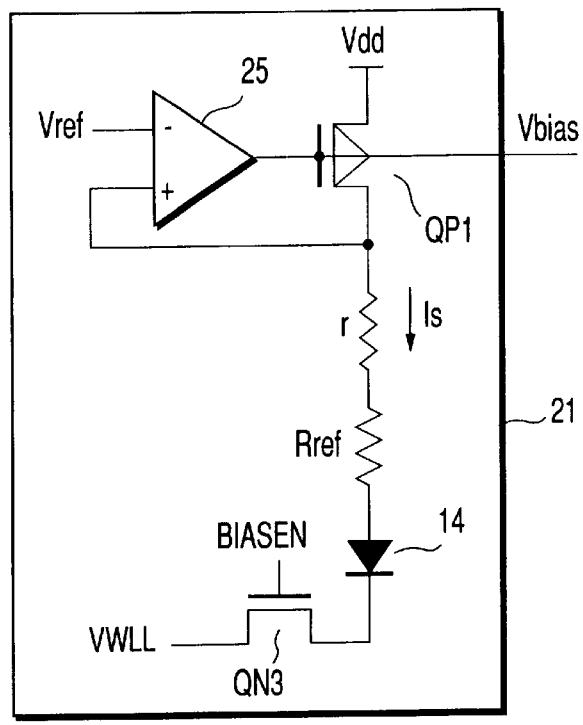
F I G. 11
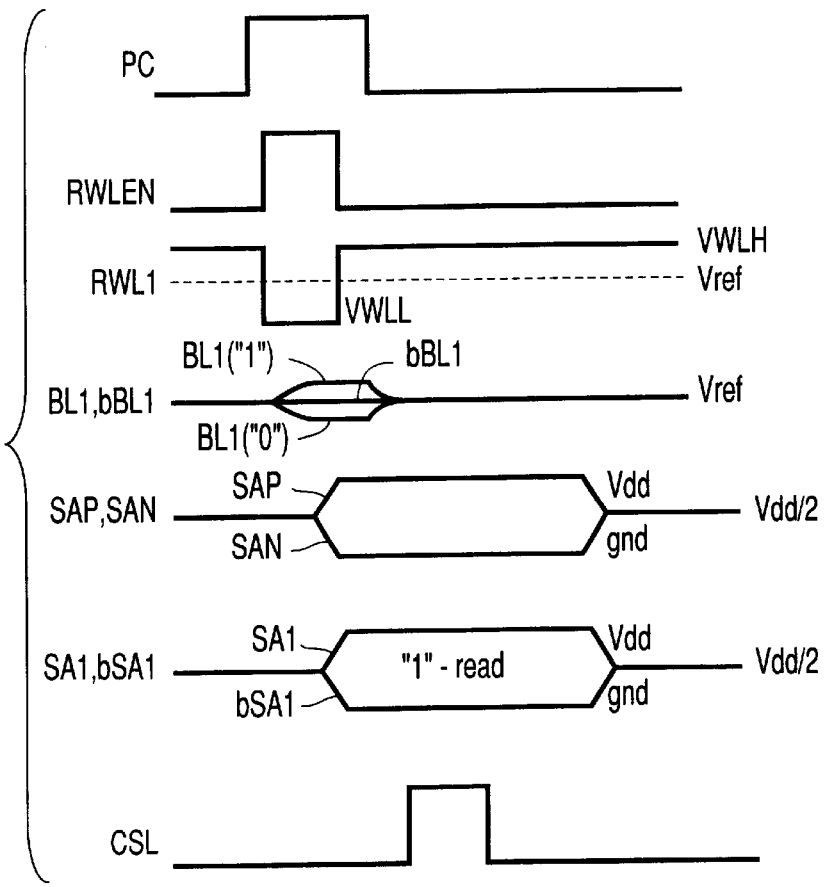
F I G. 12

MAGNETIC RANDOM ACCESS MEMORY

CROSS-REFERENCE TO RELATED APPLICATIONS

This application is based upon and claims the benefit of priority from the prior Japanese Patent Application No. 2000-395723, filed Dec. 26, 2000, the entire contents of which are incorporated herein by reference.

BACKGROUND

The present invention relates to a magnetic random access memory (Magnetic RAM) and, more particularly, to a sense amplifier for amplifying the data in a memory cell.

As researchers have recently found that an MTJ (Magnetic Tunnel Junction) has a high MR (Magneto-Resistive) ratio at room temperature, the implementation of an MRAM to which a TMR (Tunneling Magneto-Resistive) effect is applied seems to be feasible.

Before the application of the TMR effect to an MRAM, an MRAM to which a GMR (Giant Magneto-Resistance) effect is applied has been known. However, the MR ratio of an MRAM to which the GMR effect is applied is several % to about 10%. In addition, in the MRAM to which the GMR effect is applied, a current flows in a thin metal film having a low resistance, as a result, the signal level is as low as several mV.

The MRAM to which the GMR effect is applied uses a technique of canceling out variations in characteristics among a plurality of magneto-resistance elements (memory cells) to prevent a data read error due to very low signal level. Conventionally, for example, a data read operation is performed twice with respect to a single memory cell to prevent the effect of variation in characteristics among magneto-resistance elements. It is therefore difficult to realize high-speed read operation in the MRAM to which the GMR effect is applied.

When a memory cell is comprised of a magneto-resistance element and a MOS transistor, if the ON resistance of the MOS transistor is not sufficiently low, data cannot be accurately read out due to variations in the characteristics of MOS transistors.

In order to prevent such a phenomenon, the ON resistance of the MOS transistor must be decreased to a value almost equal to that of the GMR element. To decrease the ON resistance of the MOS transistor, however, the MOS transistor needs to have a considerably large size. For this purpose, the size of the MOS transistor must be considerably increased. That is, to accurately perform read operation, the size of the MOS transistor serving as a transfer gate must be increased, resulting in an increase in memory cell size. This makes it difficult to realize a large memory capacity.

As described above, serious problems are posed in a GMR and MRAM in realizing a high-speed memory operation and a large memory capacity. For this reason, the GMR and MRAM are used only under special environments, e.g., in space and nuclear reactor, owing to their characteristic feature, i.e., having excellent radiation tolerance, but are not generally used much.

Consider an MRAM using the TMR effect again. The basic structure of a TMR element is the MTJ structure in which an insulating film is sandwiched between two ferromagnetic layers. The TMR element changes in resistance depending on whether the magnetization directions of the two ferromagnetic layers are parallel (in the same direction) or anti-parallel (in opposite directions). It is generally assumed that this change is based on the spin dependence of tunneling probability.

Binary data is stored depending on whether the magnetization directions of the ferromagnetic layers of the TMR element are parallel or anti-parallel. In addition, cell data are read out by using a change in the resistance of the TMR element which depends on the magnetization directions of the two ferromagnetic layers.

The MR ratio of an MRAM using the TMR effect is several ten %, and a resistance value for the TMR element can be selected from a wide range of resistance values by changing the thickness of the insulating layer (tunnel insulating film) sandwiched between the two magnetic layers. In addition, in the MRAM using the TMR effect, the signal level in read operation may become equal to or more than the signal level in the DRAM.

In the MRAM using the TMR effect, a write operation is performed by changing the magnetization direction of the TMR element (making it parallel or anti-parallel) using the magnetic field generated by currents flowing in two lines (line word line and bit line) perpendicular to each other.

More specifically, if the two ferromagnetic layers are made to have different thicknesses to set a difference between the coercive forces of the two magnetic layers, the relative directions of magnetization of the two ferromagnetic layers can be made parallel or anti-parallel by arbitrarily reversing only the magnetization of the thinner magnetic layer (having lower coercive force). In addition, if a diamagnetic layer is added to one of the two ferromagnetic layers, and the magnetization direction of the magnetic layer to which the diamagnetic layer is added is fixed by exchange coupling, the relative directions of magnetization of the two ferromagnetic layers can be made parallel or anti-parallel by arbitrarily reversing only the magnetization of the magnetic layer to which the diamagnetic layer is not added.

A magnetic layer has the following property. Assume that the magnetization of the magnetic layer is to be reversed by applying a magnetic field in a direction opposite to the magnetization direction of the magnetic layer. In this case, if a magnetic field is applied in advance in a direction perpendicular to the magnetization direction, the magnitude of magnetic field (reversing magnetic field) required to reverse the magnetization of the magnetic layer can be reduced.

By using two lines perpendicular to each other and applying magnetic fields in two directions perpendicular to each other, only the magnetization of the memory cell at the intersection of the lines can be selectively reversed.

Several candidates for a memory cell arrangement using a TMR element are conceivable. For example, a memory cell having a combination of a TMR element and a MOS transistor, like the one shown in FIG. 1, and a memory cell having a combination of a TMR element and a diode, like the one shown in FIG. 2, are regarded as most promising candidates. Referring to FIGS. 1 and 2, a TMR element is shown as a resistive element.

To read out data from a TMR element (memory cell), a current must be supplied to the TMR element or a voltage must be applied to it to convert data (the magnetization direction of the TMR element) into a current or voltage.

If, for example, a constant current is supplied as a sense current to the TMR element (memory cell), the potential of the bit line connected to the TMR element changes depending on the data (magnetization direction) stored in the TMR element. That is, the resistance of the TMR element becomes higher when the magnetization direction is anti-parallel than when the magnetization direction is parallel. Therefore, the potential of the bit line becomes higher when the magnetization direction is parallel than when the magnetization direction is anti-parallel.

In the following description, assume that the high resistance state of the TMR element is the state in which "1" is stored in the memory cell, and the low resistance state of the TMR element is the state in which "0" is stored in the memory cell.

The prior MRAM usually comprises 2-transistors and 2-MTJ cells (2-Tr+2-MTJ). In this case, 1-bit data is stored in two memory cells. To store 1-bit data, a memory cell to store the data and a memory cell to store data having an inverted value of the value of the stored data, i.e., a total of two memory cells, are required. In addition, since complementary data are stored in the two memory cells, a read signal can be automatically detected by the differential sense scheme. In addition, the signal level becomes twice that in a case wherein data is stored in only one memory cell.

In data read operation, the potential of the bit line is changed in accordance with the data stored in the memory cell, and this potential change must be amplified. A change in the potential of the bit line may be detected as follows. For example, two bit lines may be prepared. The data in the memory cell is then read out to one bit line, and inverted data of the data in the memory cell may be read out to the other bit line.

Furthermore, as two memory cells in which complementary data are stored are arranged close to each other, even variations in characteristics among memory cells (TRM elements) raise no serial problem. For this reason, in the development of current MRAMs, the scheme of storing 1-bit data as complementary data in two memory cells is often used.

In the scheme of storing 1-bit data using two memory cells, however, the memory cell area per bit becomes twice as large as that in the scheme of storing 1-bit data in one memory cell. That is, the scheme of storing 1-bit data by using two memory cells is not suitable for the implementation of large memory capacity.

In commercialization, therefore, there are strong demands for a memory with specifications stating that 1-bit data is stored in one memory cell comprised of one magneto-resistance element and one switch element upon attaining an increase in signal level by developing a material for magnetic layers.

In order to store 1-bit data in one memory cell constituted by one magneto-resistance element and one switch element and accurately read out data from this one memory cell, a special read circuit is required. Currently, however, such read circuits have not be fully studied, sophisticated, and converged unlike DRAMs.

In the case of MRAMS, in particular, a reference potential in sense operation cannot be automatically generated.

As the simplest technique of generating a reference potential, a technique of using a fixed potential as a reference potential is available. In this case, however, the potential difference between a read potential ("0" or "1") and a reference potential varies due to the timing at which sensing starts. As a consequence, data cannot be correctly sensed in a wide range of operation conditions.

SUMMARY

A magnetic random access memory according to an aspect of the present invention comprises a memory cell having a magneto-resistance element which is constituted by a plurality of magnetic layers isolated from each other by an insulating layer and from which two resistance values corresponding to the magnetization states of the plurality of magnetic layers can be obtained, a bit line connected to the memory cell, a sense current source for supplying a sense current to the bit line and the memory cell, a sense amplifier for comparing the potential of the bit line with a reference potential when a sense current flows in the bit line and the memory cell, and detecting data in the memory cell, and a bias voltage generating circuit having a reference cell for generating a reference potential. The reference cell has a resistance value intermediate between the two resistance values of the magneto-resistance element.

BRIEF DESCRIPTION OF THE DRAWINGS

FIG. 8 is a circuit diagram showing the sense amplifier of the MRAM according to the second example of the first embodiment;

FIG. 9 is a timing chart showing the sense operation of the MRAM having the elements shown in FIGS. 3 to 5 and 8;

FIG. 11 is a circuit diagram showing an example of the bias voltage generating circuit;

FIG. 12 is a timing chart showing the sense operation of the MRAM having the elements shown in FIGS. 4, 6, 10, and 11;

DETAILED DESCRIPTION

A magnetic random access memory according to an aspect of the present invention will be described below with reference to the views of the accompanying drawing.

(1) First Embodiment

In a magnetic random access memory according to the first embodiment of the present invention, a reference cell having an MR ratio ½ that of a memory cell is formed by using a plurality of magneto-resistive elements. That is, the potential generated by a reference cell when a constant current is supplied to the reference cell is set as a predetermined constant potential.

In precharge operation, a potential equal to the constant potential generated by this reference cell is applied as a precharge potential to a bit line. In sense operation, a constant current is supplied to the reference cell, and a constant current is also supplied to the bit line (memory cell) by using a current mirror circuit.

If, for example, the data stored in the memory cell is "0" at this time, the potential of the bit line drops from the precharge potential. If the data stored in the memory cell is "1", the potential of the bit line rises from the precharge potential. A change in the potential of this bit line is also sensed by a sense amplifier.

As described above, the magnetic random access memory according to the first embodiment of the present invention can perform a read operation.

An example of the magnetic random access memory according to the first embodiment of the present invention will be described below.

FIRST EXAMPLE

Figure 3:
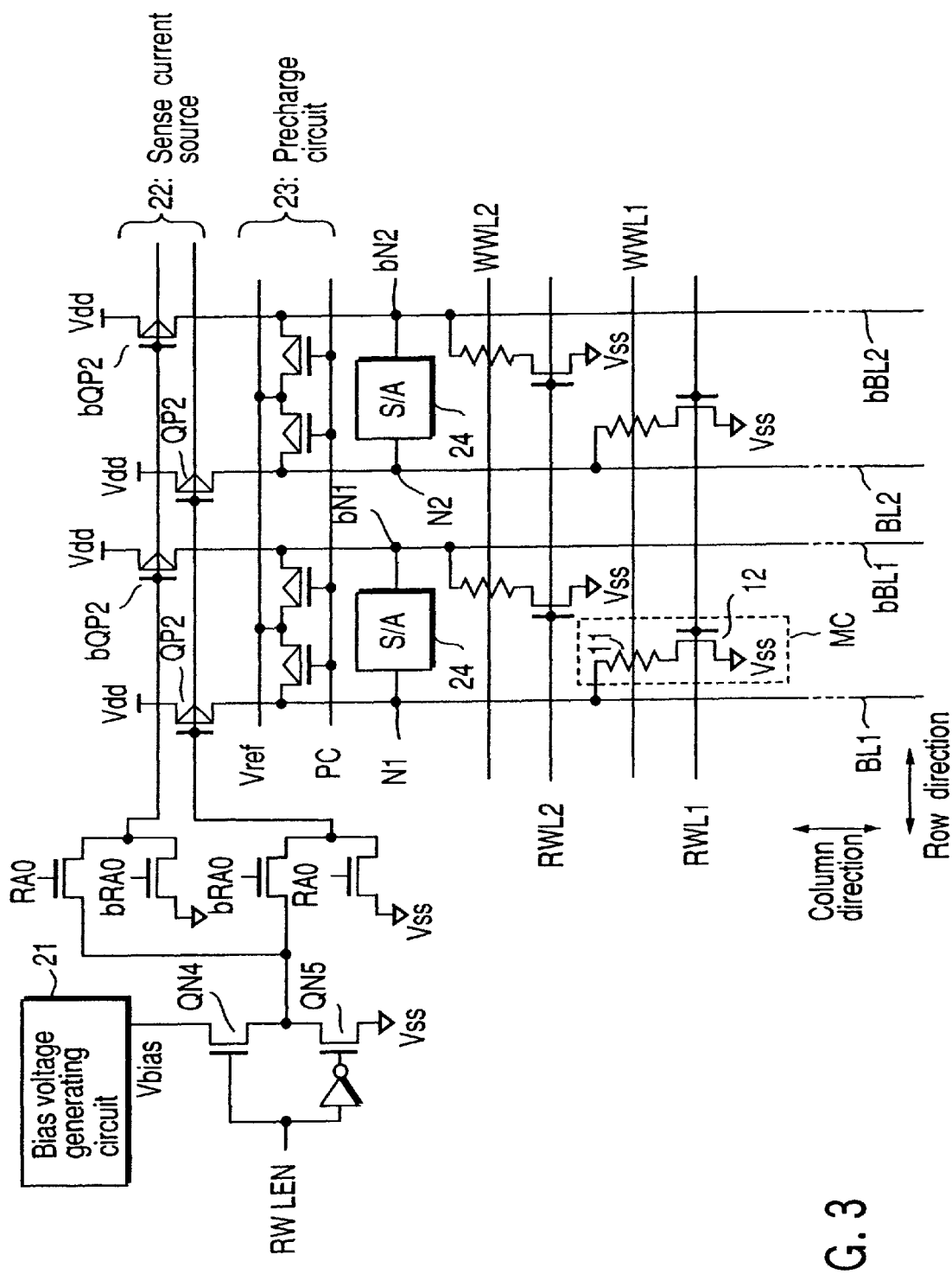
FIG. 3 is a circuit diagram showing the main part of an MRAM according to the first example of the first embodiment.

FIG. 3 shows the main part of a magnetic random access memory according to the first example of the present invention.

A memory cell MC is comprised of one magneto-resistive element 11 and one MOS transistor 12. Write word lines WWL1, WWL2, . . . and read word lines RWL1, RWL2, . . . extend in the row direction, and bit lines BL1, bBL1, BL2, bBL2, . . . extend in the column direction.

The write word lines WWL1, WWL2, . . . have no nodes on the memory cell array and are arranged to run near the magneto-resistive elements 11. That is, in write operation, the magnetization directions (parallel, anti-parallel) of the magneto-resistive elements 11 are changed by using the magnetic fields generated by currents flowing in the write word lines WWL1, WWL2, . . . and bit lines BL1, bBL1, BL2, bBL2, . . . .

The read word lines RWL1, RWL2, . . . are connected to the gates of the MOS transistors 12 as elements of memory cells MC. In read operation, the MOS transistor 12 of the selected memory cell MC is turned on to supply a constant current to the magneto-resistive element 11 of the selected cell MC, and the potentials of the bit lines BL1, bBL1, BL2, bBL2, . . . are changed in accordance with the state of the magneto-resistive element 11.

Only one sense amplifier (S/A) 24 is provided for a pair of bit lines BLi and bBLi (i=1, 2, . . . ).

In this example, the sense amplifier 24 is based on the differential sense scheme of supplying a constant current Is to the memory cell MC and detecting the potential difference produced between the pair of bit lines BLi and bBLi. In addition, the memory cell array uses the folded bit line scheme.

The memory cell array arrangement shown in FIG. 3 is an example. Obviously, the present invention can be applied to magnetic random access memories having other memory cell array arrangements.

The sense amplifier 24 compares the potential of one of the pair of bit lines BLi and bBLi to which the selected memory cell MC is connected with the potential of the other of the pair of bit lines BLi and bBLi (reference potential Vref), and amplifies the difference.

In this case, in order to equalize sense margins between "0"-read operation and "1"-read operation, the reference potential Vref is preferably set to an intermediate value (V0+V1)/2 between a potential V0 of the bit line in "0"-read operation and a potential V1 of the bit line in "1"-read operation.

If the magneto-resistive element 11 of the memory cell MC is a TMR element, a magnetic resistance change ratio MR of the TMR element is defined as $$MR=(Ra-Rp)/Rp \tag{1}$$

where Ra is the resistance of the TMR element when the magnetization states of the magnetic layers are anti-parallel, and Rp is the resistance of the TMR element when the magnetization states of the magnetic layers are parallel.

If equation (1) is modified and Rp=R, $$Ra=R(1+MR) \tag{2}$$

If a reference cell having an MR ratio ½ that of a memory cell can be generated, the reference potential Vref=(V0+V1)/2 can be obtained by supplying the constant current Is to the reference cell.

An example of the arrangement of the reference cell will be described with reference to FIG. 4.

Figure 1:
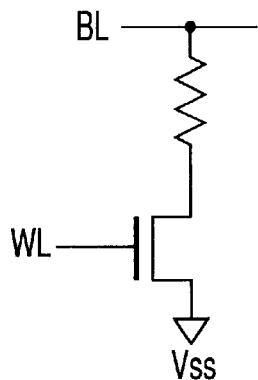
FIG. 1 is a circuit diagram showing an example of the memory cell array of an MRAM.
Figure 2:
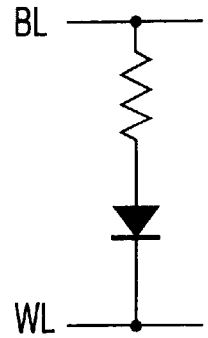
FIG. 2 is a circuit diagram showing another example of the memory cell array of an MRAM.
Figure 4:
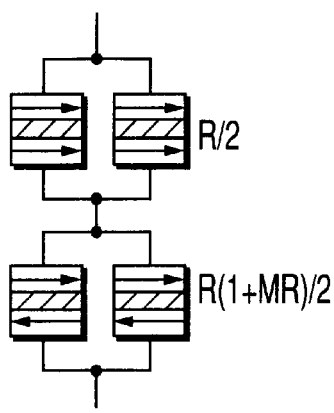
FIG. 4 is a view showing a reference cell in a bias voltage generating circuit.

Referring to FIG. 4, the magnetization directions of the respective magnetic layers are indicated by the arrows to allow quick understanding of the magnetization states of the respective magneto-resistance elements.

A reference cell is comprised of four TMR elements. Each TMR element has the same structure as that of a TMR element as an element of the memory cell MC.

Two TMR elements having parallel (same) magnetization directions ("0" state) are connected in parallel with each other, and two TMR elements having anti-parallel (opposite) magnetization directions ("1" state) are connected in parallel with each other. In addition, two TMR elements in the "0" state and two TMR elements in the "1" state are connected in series. With this operation, the resistance value of the reference cell becomes R(1+MR/2).

In this example, when the constant current Is is supplied to the reference cell, the potential generated by the reference cell becomes Vref. This reference potential Vref is determined to output a signal with a maximum level within a reliability range in consideration of the breakdown voltage of the TMR element, the bias dependence of the magnetic resistance change ratio MR, the resistance of the MOS transistor, and the like.

In read operation, a read word line enable signal RWLEN is set at "H" level. At this time, an N-channel MOS transistor QN4 is turned on, and an NMOS transistor QN5 is turned off.

If, for example, a least significant bit RA0 of a row address signal is set at "H" level, and bRA0 is set at "L"

level, an output signal Vbias from a bias voltage generating circuit 21 is transferred to the gate of a P-channel MOS transistor bQP2.

In this case, therefore, the sense current Is flows in the bit lines bBL1, bBL2, ..., and the potentials of the bit lines bBL1, bBL2, ... change in accordance with the data in the selected memory cell MC. The bit lines BL1, BL2, ... are kept at the precharge potential Vref.

If, for example, the least significant bit RA0 of the row address signal is set at "L" level, and bRA0 is set at "H" level, the output signal Vbias from the bias voltage generating circuit 21 is transferred to the gate of the P-channel MOS transistor QP2.

In this case, therefore, the sense current Is flows in the bit lines BL1, BL2, ..., and the potentials of the bit lines BL1, BL2, ... change in accordance with the data in the selected memory cell MC. In addition, the bit lines bBL1, bBL2, ... are kept at the precharge potential Vref.

Figure 5:
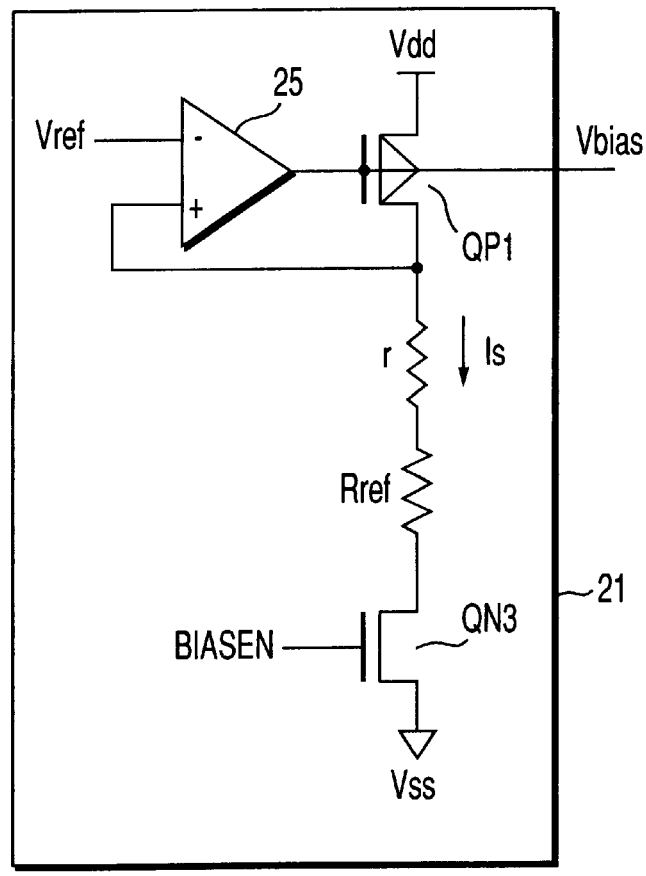
FIG. 5 is a circuit diagram showing an example of the bias voltage generating circuit.

FIG. 5 shows an example of a bias voltage generating circuit using the reference cell in FIG. 4.

As shown in FIGS. 3–5, a magneto-resistance element Rref is comprised of four magneto-resistance elements and is set such that the magnetic resistance change ratio becomes MR/2. The size of a P-channel MOS transistor QP1 having a gate to which the output signal Vbias from a differential amplifier 25 is input is substantially equal to that of the P-channel MOS transistors QP2 and bQP2 of a sense current source 22 and the N-channel MOS transistor 12 of the memory cell MC.

The P-channel MOS transistor QP1 in the bias voltage generating circuit and the P-channel MOS transistors QP2 and bQP2 of the sense current source 22 constitute a current mirror circuit.

In read operation, the sense current Is flows in the magneto-resistance element Rref and also flows in one of the pair of bit lines BLi and bBLi (i=1, 2, ...) At this time, since interconnection resistances exist in the bit lines BLi and bBLi, the potentials of the bit lines drop. As a consequence, the potential differences among sense amplifier nodes N1, bN1, N2, bN2, ... change depending on the position of the selected memory cell MC.

If, for example, access is made to the memory cell MC nearest to the sense amplifier (S/A) 24, the influences of the interconnection resistances of the bit lines BLi and bBLi are minimized. If access is made to the memory cell MC located farthest from the sense amplifier (S/A) 24, the influences of the interconnection resistances of the bit lines BLi and bBLi are maximized.

The position of a selected memory cell, i.e., the potential differences among the sense amplifier nodes N1, bN1, N2, bN2, ... due to the interconnection resistances of the bit lines BLi and bBLi become noise in sensing the data in the memory cell MC.

In order to reduce noise in such sense operation, according to the present invention, as shown in FIG. 5, an adjusting resistor r having a resistance value ½ that of the interconnection resistance of the bit lines BLi and bBLi is connected between the P-channel MOS transistor QP1 and the magneto-resistance element Rref. The simplest method of forming the adjusting resistor r, is to form an interconnection having a cross-sectional area equal to each of the bit lines BLi and bBLi and a length ½ that thereof by using the same interconnection layer as that for each of the bit lines BLi and bBLi.

If no row access is made, i.e., the read word lines RWL1, RWL2, ... are not selected, and a current is supplied to the bias current generating circuit, the current is wasted. This interferes with a reduction in current consumption.

For this reason, a bias enable signal BIASEN is set at "H" level (e.g., a potential equal to the potential to be applied to the selected read word line) only for a period during which row access is made, and is set at "L" level (e.g., the ground potential) for other periods.

With this operation, an N-channel MOS transistor QN3 is kept on for only a period during which row access is made. This makes it possible to prevent a current from being wasted in the bias generating circuit, contributing to a reduction in current consumption.

Figure 6:
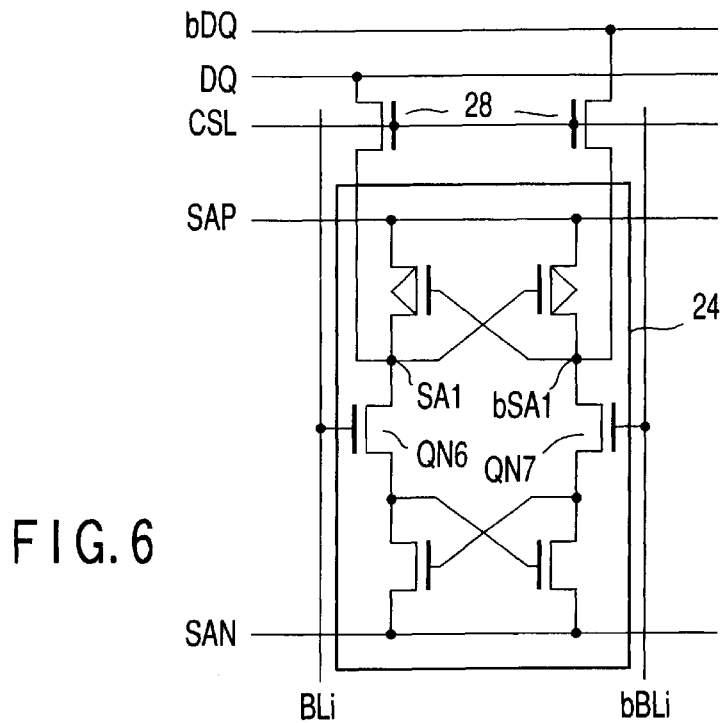
FIG. 6 is a circuit diagram showing an example of a sense amplifier.

FIG. 6 shows an example of the sense amplifier in FIG. 3.

Like a sense amplifier often used for a DRAM, the sense amplifier 24 in this example is activated by precharging control signals SAP and SAN to Vdd/2 in advance and then setting the control signal SAP at vdd (internal power supply potential) and the control signal SAN at Vss (ground potential).

The sense amplifier 24 senses and amplifies the potential difference between the bit lines BLi and bBLi. That is, the data in the selected memory cell MC is sensed by the sense amplifier 24 first, and then transferred to a pair of data lines (a pair of DQ lines) DQ and bDQ.

Note that selection of a column, i.e., electric connection between the sense amplifier 24 and the pair of data lines DQ and bDQ is performed by ON/OFF-controlling a column select switch 28 using a column select signal CSL.

Figure 7:
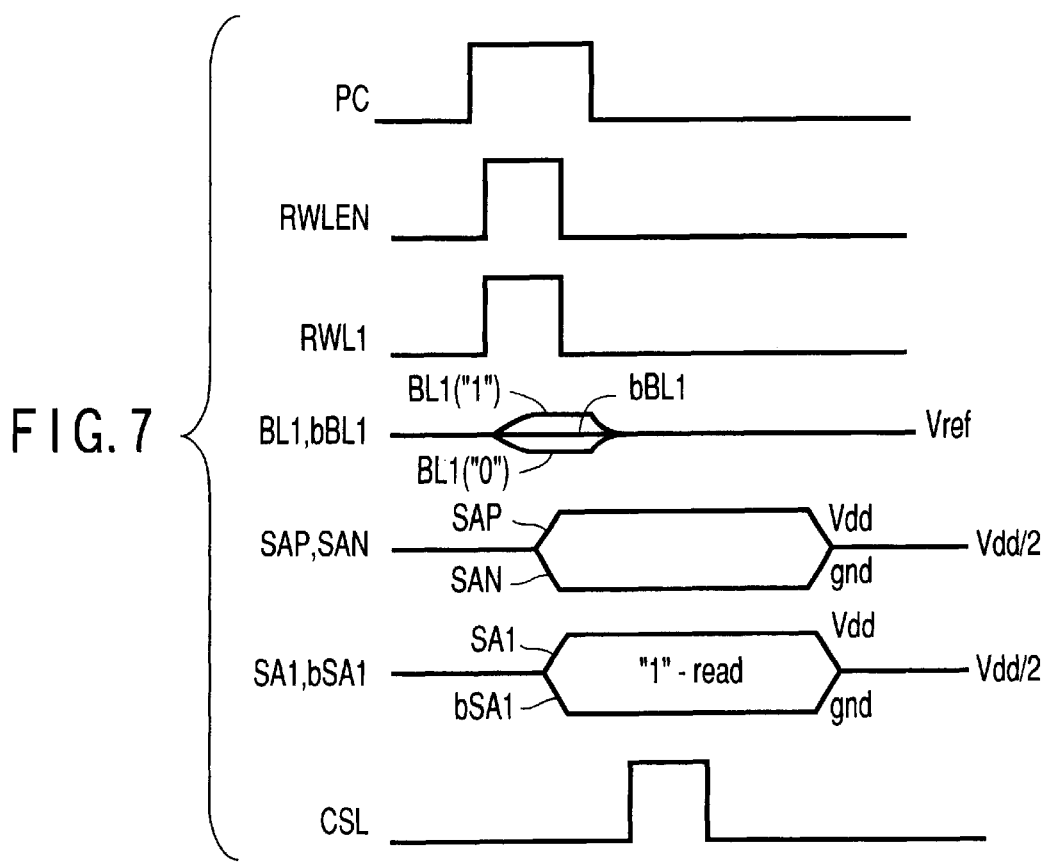
FIG. 7 is a timing chart showing the sense operation of the MRAM having the elements shown in FIGS. 3 to 6.

Sense operation in read operation in the magnetic random access memory shown in FIGS. 3 to 6 will be described next with reference to the timing chart of FIG. 7.

For the sake of simplicity, assume that in the following description, the read word line RWL1 is selected, and the data in the memory cell MC is read out to the bit line BL1.

First of all, the bit lines BLi and bBLi are precharged before the sense operation using precharge circuit 23. In a precharge operation, the precharge signal PC is set at "L" level (e.g., the ground potential), and hence all the pairs of bit lines BLi and bBLi are precharged to Vref.

When the precharge signal PC is set at "H" level (e.g., the internal power supply potential) afterward, the precharged states of the pair of bit lines BLi and bBLi are canceled.

When the read word line enable signal RWLEN is set at "H" level, the read word line RWL1 is set at "H" level by the read word line driver. At the same time, the N-channel MOS transistor QN4 in FIG. 3 is turned on. As a consequence, the bias potential Vbias output from the bias voltage generating circuit 21 is transferred to the P-channel MOS transistor QP2 or P-channel MOS transistor bQP2.

That is, the sense current Is flows in the bit lines BL1, BL2, ... to which the memory cell MC selected by the least significant bit RA0 of the row address signal and its complementary signal bRA0 is connected.

More specifically, if the least significant bit RA0 of the row address signal is "0 (=L)", for example, the read word line RWL1 is set at "H" level, and the P-channel MOS transistor QP2 is turned on. As a result, the sense current Is flows in the bit lines BL1, BL2, ... owing to a current mirror.

If the least significant bit RA0 of the row address signal "1 (=H)", for example, the read word line RWL2 is set at "H" level, and the P-channel MOS transistor bQP2 is turned on. As a result, the sense current Is flows in the bit lines bBL1, bBL2, ... owing to a current mirror.

If the data stored in the selected memory cell MC is "0", the potential of the bit line BL1 drops from the precharge potential Vref. If the data stored in the selected memory cell MC is "1", the potential of the bit line BL1 rises from the precharge potential Vref.

On the other hand, since the least significant bit RA0 of the row address signal is "0 (=L)", the P-channel MOS transistor bQP2 is in the OFF state, and the sense current Is does not flow in the bit lines bBL1, bBL2, ... Therefore, the bit lines bBL1, bB12, ... to which the selected memory cell is not connected are in the floating state and kept at the precharge potential Vref.

Thereafter, the sense amplifier 24 is activated to sense the potential difference between the pair of bit lines BL1 and bBL1.

In a sense operation, a change in the potential of the bit line BL1 with time remains the same regardless of whether the potential of the bit line BL1 rises or drops. Therefore, the potential difference produced between the pair of bit lines BL1 and bBL1 in "0"-read operation does not differ from that in "1"-read operation regardless of the timing at which the sense amplifier 24 is operated.

In this example, the potentials of the pair of bit lines BL1 and bBL1 are input to the gates of N-channel MOS transistors QN6 and QN7 in the sense amplifier 24. That is, the potential difference between the pair of bit lines BL1 and bBL1 appears as the current driving capability difference between the N-channel MOS transistors QN6 and QN7 in the sense amplifier 24.

If, therefore, the sense amplifier activation signal SAP is set at Vdd from Vdd/2, and the sense amplifier activation signal SAN is set at Vss from Vdd/2, the sense amplifier 24 is activated to latch the data from the memory cell MC.

More specifically, in "0"-read operation, an output node SA1 of the sense amplifier 24 is set at Vss (=gnd), and an output node bSA1 of the sense amplifier 24 is set at Vdd. In "1"-read operation, the output node SA1 of the sense amplifier 24 is set at Vdd, and the output node bSA1 of the sense amplifier 24 is set at Vss.

After this operation, the column select signal CSL is set at "H" level to transfer the data latched by the sense amplifier 24 to an output circuit through the pair of data lines (the pair of DQ lines) DQ and bDQ.

In the above sense operation, a restore operation like that performed in a DRAM is not performed for the following reason. Since a magnetic random access memory (MRAM) is capable of a nondestructive data read, the data need not be rewritten in the memory cell. Therefore, the potentials of the pair of bit lines BL1 and bBL1 need not go full swing for data restore operation.

In addition, since the potentials of the pair of bit lines BL1 and bBL1 need not go full swing after data sensing, the amount of charge required for charging/discharging of the pair of bit lines BL1 and bBL1 decreases, contributing to a reduction in power consumption. In addition, since this can prevent a high voltage from being applied to a magneto-resistance element (TMR element), the reliability of the magneto-resistance element can be improved.

Furthermore, since no restore operation is required, after the data in the memory cell MC is sufficiently output to the bit line BL1, the selected read word line RWL1 can be quickly dropped from "H" level to "L" level. That is, since the potential level of the read word line RWL1 need not be raised for data restore operation, the potential level of the read word line RWL1 can be lowered to stop the sense current Is flowing in the bit line BL1 immediately after the data is output to the bit line BL1. This makes it possible to eliminate the waste of power and attain a reduction in power consumption.

After the data in the memory cell MC is latched by the sense amplifier 24, all the pairs of bit lines BLi and bBLi can be quickly precharged for the next read cycle, thus realizing high-speed read operation.

As described above, in magnetic random access memory (MRAM), since a nondestructive read operation is performed, no restore operation is required, and the potentials of a pair of bit lines need not go full swing. The bit lines and the sense amplifiers can be precharged independently. Therefore, as for a read operation, the magnetic random access memory can realize high-speed random access with low power consumption as compared with the DRAM.

SECOND EXAMPLE

A magnetic random access memory (MRAM) according to this example is characterized in the arrangement of each sense amplifier. That is, the magnetic random access memory according to this example differs from the magnetic random access memory according to the first example described above only in the arrangement of each sense amplifier, but other arrangements of the second example are completely the same as those of the first example.

Only the arrangement of each sense amplifier according to this example will therefore be described below.

FIG. 8 shows a sense amplifier 24 of the magnetic random access memory according to the second example of the present invention.

This sense amplifier is a flip-flop sense amplifier used in a general DRAM.

N-channel MOS transistors QN8 and QN9 serving as isolate gates are connected between a pair of bit lines BLi and bBLi and a flop-flop circuit. After the potentials of the pair of bit lines BLi and bBLi are fed to nodes SA1 and bSA1 of the flip-flop circuit, the isolate gates are turned off. A sense amplifier 24 is then activated while the pair of bit lines BLi and bBLi are isolated from the flip-flop circuit.

The sense operation of the magnetic random access memory according to the second example of the present invention will be described next with reference to the timing chart of FIG. 9.

Assume that the arrangement of the main part of the magnetic random access memory is the same as that of the magnetic random access memory according to the first example (see FIGS. 3, 4, and 5) except for the sense amplifiers. For the sake of simplicity, assume that a read word line RWL1 is selected, and the data in a memory cell MC is read out to a bit line BL1.

First of all, a pair of bit lines BLi and bBLi are precharged before the sense operation. In a precharge operation, since a precharge signal PC is set at "L" level (e.g., the ground potential), all the pairs of bit lines BLi and bBLi are precharged to vref.

At this time, since a control signal ISO is set at "H" level (e.g., an internal power supply potential Vdd), the sense amplifier nodes SA1 and bSA1 are also precharged to Vref. In addition, sense amplifier activation signals SAP and SAN are set at Vref.

When the precharge signal PC is set at "H" level (e.g., the internal power supply potential) afterward, the precharged states of the pair of bit lines BLi and bBLi are canceled.

When the read word line enable signal RWLEN is set at THE level, the read word line RWL1 is set at "H" level by the read word line driver. At the same time, since an N-channel MOS transistor QN4 in FIG. 3 is turned on, a bias potential Vbias output from the bias voltage generating circuit 21 is transferred to a P-channel MOS transistor QP2 or P-channel MOS transistor bQP2.

That is, a sense current Is flows in bit lines BL1, BL2, ... to which the memory cell MC selected by a least significant bit RA0 of a row address signal and its complementary signal bRA0 is connected.

More specifically, if the least significant bit RA0 of the row address signal is at "0 (=L)", for example, the read word line RWL1 is set at "H" level, and the P-channel MOS transistor QP2 is turned on. As a consequence, the sense current Is flows in the bit lines BL1, BL2, . . . owing to a current mirror.

If the least significant bit RA0 of the row address signal is "1 (=H)", for example, a read word line RWL2 is set at "H" level, and the P-channel MOS transistor bQP2 is turned on. Consequently, the sense current Is flows in the bit lines bBL1, bBL2, . . . owing to a current mirror.

As a consequence, if the data stored in the selected memory cell MC is "0", the potential of the bit line BL1 drops from the precharge potential Vref. If the data stored in the selected memory cell MC is "1", the potential of the bit line BL1 rises from the precharge potential Vref.

On the other hand, since the least significant bit RA0 of the row address signal is "0 (=L)", the P-channel MOS transistor bQP2 is in the OFF state, and the sense current Is does not flow in bit lines bBL1, bBL2, . . . The bit lines bBL1, bBL2, . . . to which the selected memory cell is not connected are in the floating state and kept at the precharge potential Vref.

Thereafter, the sense amplifier 24 is activated to sense the potential difference between the pair of bit lines BL1 and bBL1.

In a sense operation, a change in the potential of the bit line BL1 with time remains the same regardless of whether the potential of the bit line BL1 rises or drops. Therefore, the potential difference produced between the pair of bit lines BL1 and bBL1 in "0"-read operation does not differ from that in "1"-read operation regardless of the timing at which the sense amplifier 24 is operated.

In this example, the pair of bit lines BLi and bBLi are connected to the nodes (sense amplifier nodes) SA1 and bSA1 of the flip-flop circuit through the N-channel MOS transistors QN8 and QN9 serving as isolate gates.

In a sense operation, when data is sufficiently output from a memory cell to the pair of bit lines BLi and bBLi, and the small potential difference between the pair of bit lines BLi and bBLi is transferred to the sense amplifier nodes SA1 and bSA1, the control signal ISO is set at "L" level (e.g., the ground potential). As a consequence, the N-channel MOS transistors QN8 and QN9 serving as isolate gates are turned off, and the pair of bit lines BLi and bBLi and flip-flop circuit are electrically isolated from each other.

Subsequently, the sense amplifier activation signal SAP is set at Vdd from Vref, and the sense amplifier activation signal SAN is set at Vss from Vref. With this operation, the sense amplifier 24 is activated, and the data in the memory cell MC is latched by the sense amplifier 24.

More specifically, in "0"-read operation, the output node SA1 of the sense amplifier 24 is set at Vss (=gnd), and the output node bSA1 of the sense amplifier 24 is set at Vdd. In "1"-read operation, the output node SA1 of the sense amplifier 24 is set at Vdd, and the output node bSA1 of the sense amplifier 24 is set at Vss.

In this case, in amplifying the data, the sense amplifier (flip-flop circuit) is electrically isolated from the pair of bit lines BLi and bBLi. That is, since the parasitic capacitances produced in the pair of bit lines BLi and bBLi are not connected to the sense amplifier nodes SA1 and bSA1, the data can be amplified at high speed.

Subsequently, a column select signal CSL is set at "H" level to transfer the data latched by the sense amplifier 24 to an output circuit through a pair of data lines (a pair of DQ lines) DQ and bDQ.

Since the magnetic random access memory (MRAM) is capable of nondestructive data read operation, no data restore operation is required in the above sense operation as in the first example. That is, the potentials of the pair of bit lines BLi and bBLi need not go full swing for data restore operation.

In addition, since the potentials of the pair of bit lines BL1 and bBL1 need not go full swing after data sensing, the amount of charge required for charging/discharging of the pair of bit lines BL1 and bBL1 decreases, contributing to a reduction in power consumption. In addition, since this can prevent a high voltage from being applied to a magneto-resistance element (TMR element), the reliability of the magneto-resistance element can be improved.

Furthermore, since no restore operation is required, after the data in the memory cell MC is sufficiently output to the bit line Bb1, the selected read word line RWL1 can be quickly dropped from "H" level to "L" level. That is, since the potential level of the read word line RWL1 need not be raised for data restore operation, the potential level of the read word line RWL1 can be lowered to stop the sense current Is flowing in the bit line BL1 immediately after the data is output to the bit line BL1. This makes it possible to eliminate the waste of power and attain a reduction in power consumption.

After the data in the memory cell MC is latched by the sense amplifier 24, all the pairs of bit lines BLi and bBLi can be quickly precharged for the next read cycle, thus realizing high-speed read operation.

As described above, in a magnetic random access memory (MRAM), since a nondestructive read operation is performed, no restore operation is required, and the potentials of a pair of bit lines need not go full swing. The bit lines and the sense amplifiers can be precharged independently. Therefore, as for a read operation, the magnetic random access memory can realize high-speed random access with low power consumption as compared with the DRAM.

Note that in this example, the control signal ISO for ON/OFF-controlling each isolate gate is required, unlike the first example. As described above, although the control signal ISO is additionally used in this example, the influence of variations in the characteristics of transistors having gates for receiving the potentials of the pair of bit lines BLi and bBLi can be eliminated.

THIRD EXAMPLE

A magnetic random access memory (MRAM) according to this example is characterized in that a memory cell is comprised of a magneto-resistance element (e.g., a TMR element) and a diode. The magnetic random access memory according to this example will be described in detail below.

Figure 10:
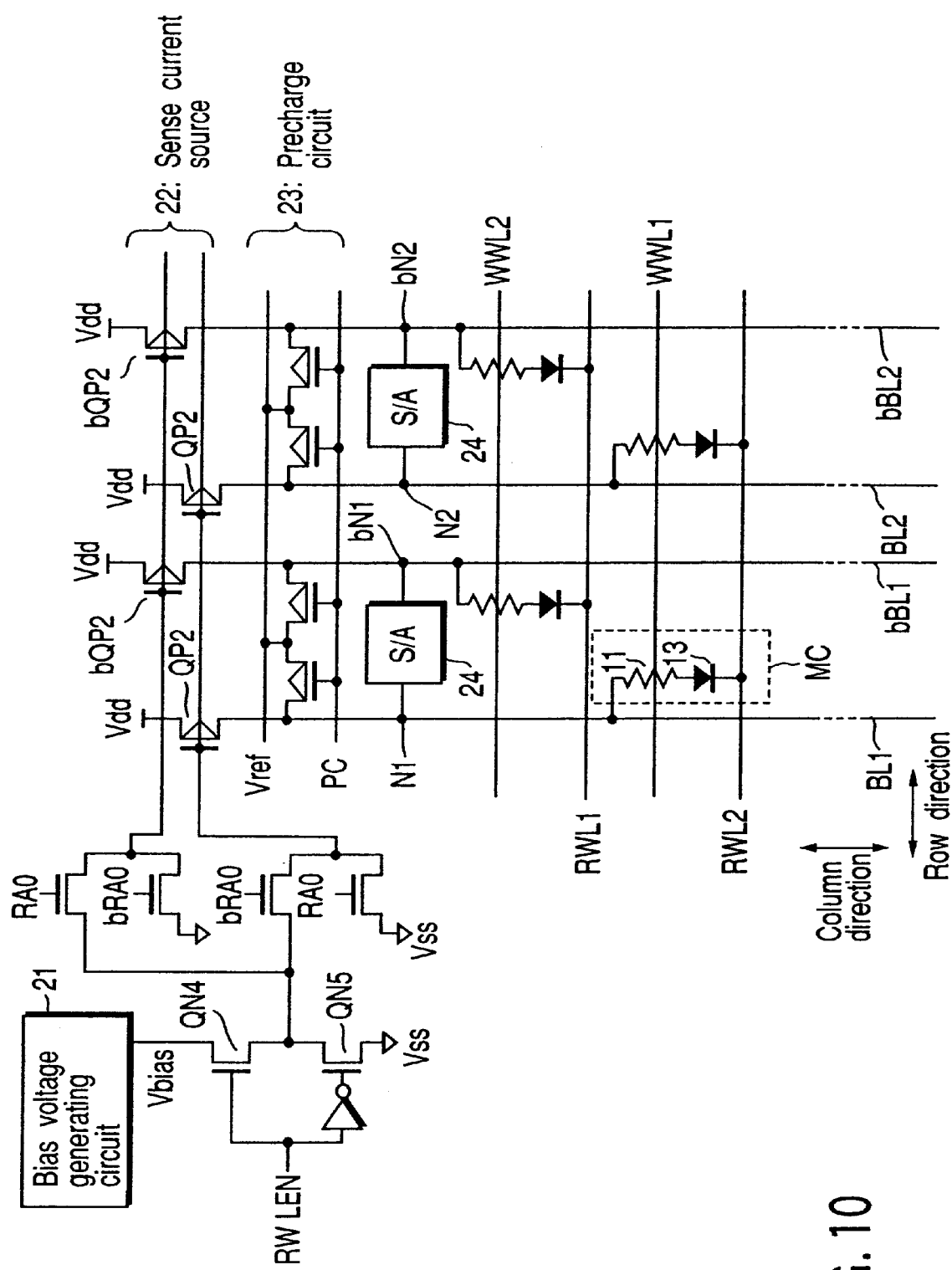
FIG. 10 is a circuit diagram showing the main part of the MRAM according to the third example of the first embodiment.

FIG. 10 shows the main part of the magnetic random access memory according to the third example.

A memory cell MC is comprised of one magneto-resistive element 11 and one diode 13. Write word lines WWL1, WWL2, . . . and read word lines RWL1, RWL2, . . . extend in the row direction, and bit lines BL1, bBL1, BL2, bBL2, . . . extend in the column direction.

The write word lines WWL1, WWL2, . . . have no nodes on the memory cell array and are arranged to run near the magneto-resistive elements 11. That is, in write operation, the magnetization directions (parallel, anti-parallel) of the magneto-resistive elements 11 are changed by using the magnetic fields generated by currents flowing in the write word lines WWL1, WWL2, . . . and bit lines BL1, bBL1, BL2, bBL2, . . . .

The read word lines RWL1, RWL2, . . . are connected to the cathodes of the diodes 13 as elements of memory cells MC. In a read operation, the diode 13 of the selected memory cell MC is forward-biased to supply a constant current to the magneto-resistive element 11 of the selected memory cell MC, and the potentials of the bit lines BL1, bBL1, BL2, bBL2, . . . are changed in accordance with the state of the magneto-resistive element 11.

Only one sense amplifier (S/A) 24 is provided for a pair of bit lines BLi and bBLi (i=1, 2, . . . ).

In this example, the sense amplifier 24 is based on the differential sense scheme of supplying a constant current Is to the memory cell MC and detecting the potential difference produced between the pair of bit lines BLi and bBLi. In addition, the memory cell array uses the folded bit line scheme.

The memory cell array arrangement shown in FIG. 10 is an example. Obviously, the present invention can be applied to magnetic random access memories having other memory cell array arrangements.

The sense amplifier 24 compares the potential of one of the pair of bit lines BLi and bBLi to which the selected memory cell MC is connected with the potential of the other of the pair of bit lines BLi and bBLi (reference potential Vref), and amplifies the difference.

In this case, in order to equalize sense margins between "0"-read operation and "1"-read operation, the reference potential Vref is preferably set to an intermediate value (V0+V1)/2 between a potential V0 of the bit line in "0"-read operation and a potential V1 of the bit line in "1"-read operation.

Note that a reference cell can be formed by four TMR elements like those shown in FIG. 4 as in the first example.

In this example as well, when the constant current Is is supplied to the reference cell, the potential generated by the reference cell becomes Vref. This reference potential Vref is determined to output a signal with a maximum level within a reliability range in consideration of the breakdown voltage of the TMR element, the bias dependence of the magnetic resistance change ratio MR, the resistance of the MOS transistor, and the like.

In a read operation, a read word line enable signal RWLEN is set at "H" level. At this time, an N-channel MOS transistor QN4 is turned on, and an NMOS transistor QN5 is turned off.

If, for example, a least significant bit RA0 of a row address signal is set at "H" level, and bRA0 is set at "L" level, an output signal Vbias from a bias voltage generating circuit 21 is transferred to the gate of a P-channel MOS transistor bQP2.

In this case, therefore, the sense current Is flows in the bit lines bBL1, bBL2, . . . , and the potentials of the bit lines bBL1, bBL2, . . . change in accordance with the data in the selected memory cell MC. The bit lines BL1, BL2, . . . are kept at the precharge potential Vref.

If, for example, the least significant bit RA0 of the row address signal is set at "L" level, and bRA0 is set at "H" level, the output signal Vbias from the bias voltage generating circuit 21 is transferred to the gate of the P-channel MOS transistor QP2.

In this case, therefore, the sense current Is flows in the bit lines BL1, BL2, . . . , and the potentials of the bit lines BL1, BL2, . . . change in accordance with the data in the selected memory cell MC. In addition, the bit lines bBL1, bBL2, . . . are kept at the precharge potential Vref.

FIG. 11 shows an example of a bias voltage generating circuit in FIG. 10.

As shown in FIGS. 4, 10, and 11, a magneto-resistance element Rref is comprised of four magneto-resistance elements and is set such that the magnetic resistance change ratio becomes MR/2. The size of a P-channel MOS transistor QP1 having a gate to which the output signal Vbias from a differential amplifier 25 is input is substantially equal to that of the P-channel MOS transistors and QP2 and bQP2 of a sense current source 22.

The P-channel MOS transistor QP1 in the bias voltage generating circuit and the P-channel MOS transistors QP2 and bQP2 of the sense current source 22 constitute a current mirror circuit.

In a read operation, the sense current Is flows in the magneto-resistance element Rref and also flows in one of the pair of bit lines BLi and bBLi (i=1, 2, . . . ) At this time, since interconnection resistances exist in the bit lines BLi and bBLi, the potentials of the bit lines drop. As a consequence, the potential differences among sense amplifier nodes N1, bN1, N2, bN2, . . . change depending on the position of the selected memory cell MC.

If, for example, access is made to the memory cell MC nearest to the sense amplifier (S/A) 24, the influences of the interconnection resistances of bit lines BLi and bBLi are minimized. If access is made to the memory cell MC located farthest from the sense amplifier (S/A) 24, the influences of the interconnection resistances of the bit lines BLi and bBLi are maximized.

The position of a selected memory cell, i.e., the potential differences among the sense amplifier nodes N1, bN1, N2, bN2, . . . due to the interconnection resistances of the bit lines BLi and bBLi become noise in sensing the data in the memory cell MC.

In order to reduce noise in such a sense operation, according to the present invention, as shown in FIG. 11, an adjusting resistor r having a resistance value ½ that of the interconnection resistance of the bit lines BLi and bBLi is connected between the P-channel MOS transistor QP1 and the magneto-resistance element Rref. The simplest method of forming the adjusting resistor r, is to form an interconnection having a cross-sectional area equal to each of the bit lines BLi and bBLi and a length ½ that thereof by using the same interconnection layer as that for each of the bit lines BLi and bBLi.

If no row access is made, i.e., the read word lines RWL1, WL2, . . . are not selected, and a current is supplied to the bias current generating circuit, the current is wasted. This interferes with a reduction in current consumption.

For this reason, a bias enable signal BIASEN is set at "H" level (e.g., a potential equal to the potential to be applied to the selected read word line) only for a period during which row access is made, and is set at "L" level (e.g., the ground potential) for other periods.

With this operation, an N-channel MOS transistor QN3 is kept on for only a period during which row access is made. This makes it possible to prevent a current from being wasted in the bias generating circuit, contributing to a reduction in current consumption.

The bias voltage generating circuit in this example differs from the one shown in FIG. 5 in that a diode 14 is connected between a magneto-resistance element Rref and the N-channel MOS transistor QN3, and a control signal VWLL is input to the source of the N-channel MOS transistor QN3.

The control signal VWLL indicates an "L"-level potential of potentials to be applied to a read word line RWLi, which is equal to the potential to be applied to the selected read word line, i.e., the ground potential. The size of the N-channel MOS transistor QN3 is set to be equal to the size of an N-channel MOS transistor for applying VWLL (ground potential) to the read word line RWLi.

Reference symbol r denotes a resistor approximating the interconnection resistance of a bit line. A resistor approximating the interconnection resistance of a word line may be connected between the P-channel MOS transistor QP1 and the magneto-resistance element (reference cell) Rref.

Note that as the sense amplifier 24, for example, the sense amplifier used in the first example (see. FIG. 6) can be used without any change or the sense amplifier used in the second example (see FIG. 8) can be used without any change.

A sense operation in a read operation in the magnetic random access memory shown in FIGS. 10 and 11 will be described next with reference to the timing chart of FIG. 12.

Note that the same sense amplifier as that used in the first example (FIG. 6) is used. For the sake of simplicity, assume that the read word line RWL1 is selected, and the data in the memory cell MC is read out to the bit line BL1.

First of all, the bit lines BLi and bBLi are precharged before a sense operation. In a precharge operation, a precharge signal PC is set at "L" level (e.g., the ground potential), and hence all the pairs of bit lines BLi and bBLi are precharged to Vref.

At this time, the read word line RWL1 is at the "H" level, i.e., VWLH. Since the potential VWLH is higher than Vref, the diode 13 in the memory cell MC is reverse-biased. Ideally, therefore, no current flows in the memory cell MC.

When the precharge signal PC is set at "H" level (e.g., the internal power supply potential) afterward, the precharged states of the pair of bit lines BLi and bBLi are canceled.

When a read word line enable signal RWLEN is set at "H" level, the selected read word line RWL1 is changed from "H" level to "L" level, i.e., from VWLH to VWLL, by the read word line driver. Therefore, the diode 13 in the memory cell MC connected to the selected read word line RWL1 is forward-biased.

If the potential VWLH is lower than the bit line potential at the time of "0"-read operation, the diode 13 in the unselected memory cell MC is kept reverse-biased. Hence, no current flows in the memory cell MC.

At the same time, since the N-channel MOS transistor QN4 in FIG. 10 is turned on, the bias potential Vbias output from the bias voltage generating circuit 21 is transferred to the P-channel MOS transistor QP2 or P-channel MOS transistor bQP2.

That is, the sense current Is flows in the bit lines BL1, BL2, . . . to which the memory cell MC selected by the least significant bit RA0 of the row address signal and its complementary signal bRA0 is connected.

In this example, since it is assumed that the least significant bit RA0 of the row address signal is "0 (=L)", the read word line RWL1 is set at "L" level, and the P-channel MOS transistor QP2 is turned on. The sense current Is flows in the bit lines BL1, BL2, . . . owing to a current mirror.

If, therefore, the data stored in the selected memory cell MC is "0", the potential of the bit line BL1 drops from the precharge potential Vref. If the data stored in the selected memory cell MC is "1", the potential of the bit line BL1 rises from the precharge potential Vref.

Note that since the least significant bit RA0 of the row address signal is "0 (=L)", the P-channel MOS transistor bQP2 is in the OFF state, and the sense current Is does not flow in the bit lines bBL1, bBL2, . . . . Therefore, the bit lines bBL1, bBL2, . . . to which the selected memory cell is not connected are in the floating state and kept at the precharge potential Vref.

As described above, when the sense current Is flows in the memory cell MC, the magnetization state of the magneto-resistive element appears as the potential difference between the pair of bit lines BL1 and bBL1. Thereafter, the sense amplifier 24 is activated to sense the potential difference between the pair of bit lines BL1 and bBL1.

In a sense operation, a change in the potential of the bit line BL1 with time remains the same regardless of whether the potential of the bit line BL1 rises or drops. Therefore, the potential difference produced between the pair of bit lines BL1 and bBL1 in "0"-read operation does not differ from that in "1"-read operation regardless of the timing at which the sense amplifier 24 is operated.

In this example, the potentials of the pair of bit lines BL1 and bBL1 are input to the gates of N-channel MOS transistors QN6 and QN7 in the sense amplifier 24. That is, the potential difference between the pair of bit lines BL1 and bBL1 appears as the current driving capability difference between the N-channel MOS transistors QN6 and QN7 in the sense amplifier 24.

If, therefore, the sense amplifier activation signal SAP is set at Vdd from Vdd/2, and the sense amplifier activation signal SAN is set at Vss from Vdd/2, the sense amplifier 24 is activated to latch the data from the memory cell MC.

More specifically, in a "0"-read operation, an output node SA1 of the sense amplifier 24 is set at Vss (=gnd), and an output node bSA1 of the sense amplifier 24 is set at Vdd. In a "1"-read operation, the output node SA1 of the sense amplifier 24 is set at Vdd, and the output node bSA1 of the sense amplifier 24 is set at Vss.

After this operation, the column select signal CSL is set at "H" level to transfer the data latched by the sense amplifier 24 to an output circuit through the pair of data lines (the pair of DQ lines) DQ and bDQ.

With regard to the above sense operation, after the data is latched in the sense amplifier 24, the potential VWLL of the read word line RWL1 may be immediately restored to the potential VWLH, and the bit lines may be precharged for the next read cycle.

In the above sense operation, restore operation like that performed in a DRAM is not performed for the following reason. Since a magnetic random access memory (MRAM) is capable of a nondestructive data read, the data need not be rewritten in the memory cell. Therefore, the potentials of the pair of bit lines BL1 and bBL1 need not go full swing for data restore operation.

In addition, since the potentials of the pair of bit lines BL1 and bBL1 need not go full swing after data sensing, the amount of charge required for charging/discharging of the pair of bit lines BL1 and bBL1 decreases, contributing to a reduction in power consumption. In addition, since this can prevent a high voltage from being applied to a magneto-resistance element (TMR element), the reliability of the magneto-resistance element can be improved.

Furthermore, since no restore operation is required, after the data in the memory cell MC is sufficiently output to the bit line BL1, the selected read word line RWL1 can be quickly dropped from VWLL to VWLH. That is, since the potential level of the read word line RWL1 need not be lowered for data restore operation, the potential level of the read word line RWL1 can be raised to stop the sense current Is flowing in the bit line BL1 immediately after the data is output to the bit line BL1. This makes it possible to eliminate the waste of power and attain a reduction in power consumption.

After the data in the memory cell MC is latched by the sense amplifier 24, all the pairs of bit lines BLi and bBLi can be quickly precharged for the next read cycle, thus realizing high-speed read operation.

As described above, in a magnetic random access memory (MRAM), since nondestructive read operation is performed, no restore operation is required, and the potentials of a pair of bit lines need not go full swing. The bit lines and the sense amplifiers can be precharged independently. Therefore, as for a read operation, the magnetic random access memory can realize high-speed random access with low power consumption as compared with the DRAM.

SUMMARY

According to the first embodiment of the present invention, a reference cell having an MR ratio ½ that of a memory cell is formed by using a plurality of magneto-resistive elements. In precharge operation, the same potential as the constant potential generated by this reference cell is applied as a precharge potential to a bit line. In sense operation, a constant current is supplied to the reference cell, and a constant current is also supplied to the bit line (memory cell) by using the current mirror circuit. This makes it possible to perform a read operation in the same manner as a DRAM. If, therefore, an MRAM is to be developed as a substitute for a DRAM, compatibility with the DRAM can be improved.

(2) Second Embodiment

According to the first embodiment of the present invention, there is proposed the technique of forming a reference cell having an MR ratio ½ that of a memory cell by using a plurality of magneto-resistance elements and generating the reference potential Vref used for sense operation by supplying a constant current to the reference cell. Each magneto-resistance element is basically formed by the same step as that for a magneto-resistance element used for a memory cell with the same layout as that thereof.

However, a reference cell is formed by combining a plurality of magneto-resistance elements, interconnections and the like are required to connect the respective magneto-resistance elements. The reference cell therefore has a structure different from the magneto-resistance element of the memory cell as a whole. In consideration of the layout of a memory cell array and peripheral circuit, it is difficult to place a reference cell under completely the same environment as that for the magneto-resistance element in a memory cell.

In some cases, therefore, reference cells may not be formed within the range of variations in the characteristics of magneto-resistance elements in memory cells.

The second embodiment has been made in consideration of the above situation and is characterized in that a reference potential Vref is generated by using a memory cell (dummy cell) in a memory cell array. More specifically, sense currents are supplied to a memory cell storing "0"-data ("0"-cell) and a memory cell storing "1"-data ("1"-cell).

Assume that when sense currents are supplied to the respective memory cells, the potential of a bit line connected to the "0"-cell is represented by V0, and the potential of a bit line connected to the "1"-cell is represented by V1. In this case, by short-circuiting the respective bit lines, an intermediate potential (V0+V1)/2 most suitable for a reference potential Vref can be obtained.

If specific memory cells in a memory cell array are used as dummy cells to generate the reference potential Vref, the accurate reference potential Vref can be generated. This can contribute to an improvement of the reliability of the magnetic random access memory (MRAM).

Examples of the second embodiment will be described in detail below.

FIRST EXAMPLE

Figure 13:
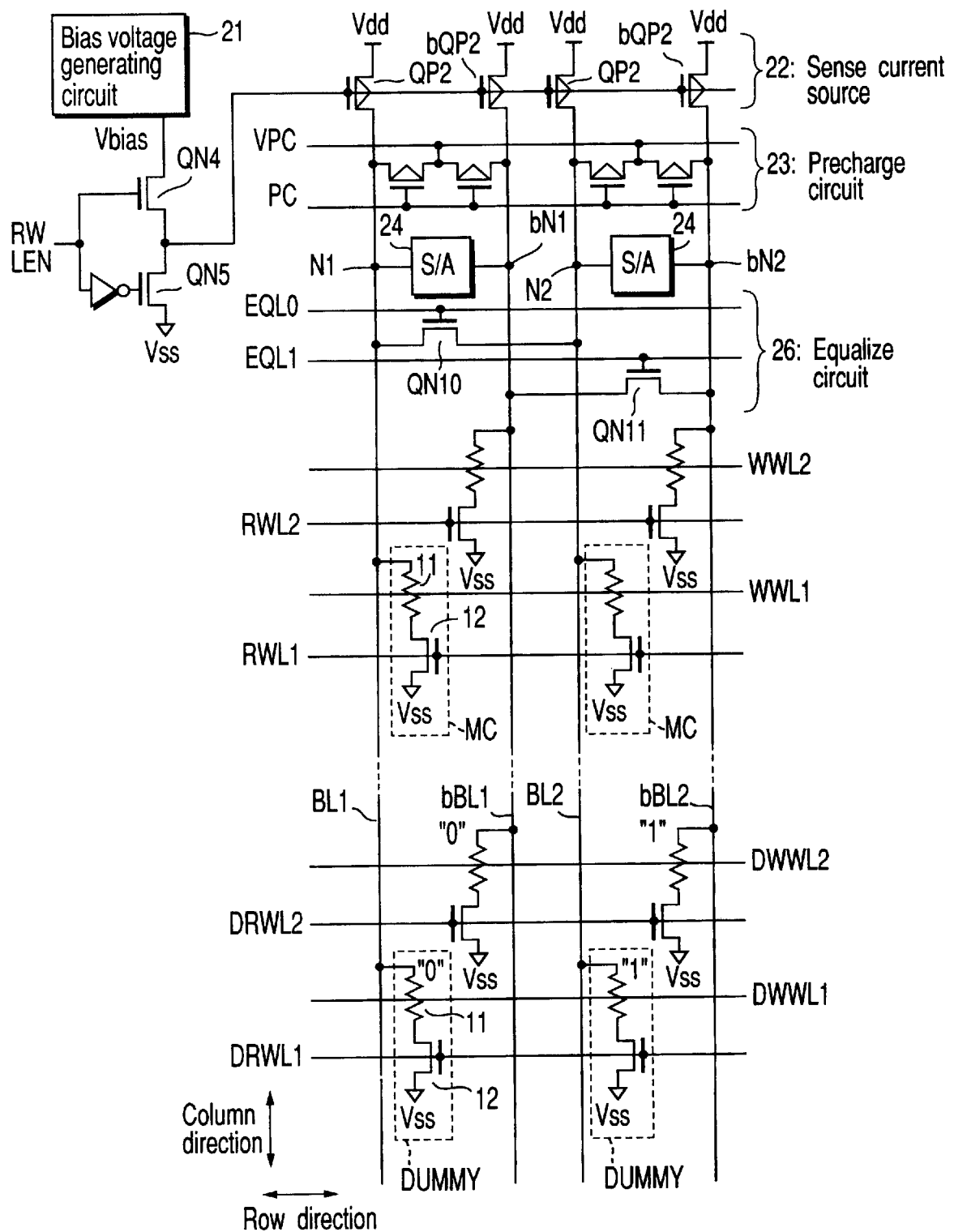
FIG. 13 is a circuit diagram showing the main part of an MRAM according to the first example of the second embodiment.

FIG. 13 shows the main part of a magnetic random access memory according to the first example of the second embodiment.

A memory cell MC is comprised of one magneto-resistive element 11 and one MOS transistor 12. Write word lines WWL1, WWL2, . . . and read word lines RWL1, RWL2, . . . extend in the row direction, and bit lines BL1, bBL1, BL2, bBL2, . . . extend in the column direction.

The write word lines WWL1, WWL2, . . . have no nodes on the memory cell array and are arranged to run near the magneto-resistive elements 11. That is, in a write operation, the magnetization directions (parallel, anti-parallel) of the magneto-resistive elements 11 are changed by using the magnetic fields generated by currents flowing in the write word lines WWL1, WWL2, . . . and bit lines BL1, bBL1, BL2, bBL2, . . . .

The read word lines RWL1, RWL2, . . . are connected to the gates of the MOS transistors 12 as elements of memory cells MC. In a read operation, the MOS transistor 12 of the selected memory cell MC is turned on to supply a constant current to the magneto-resistive element 11 of the selected memory cell MC, and the potentials of the bit lines BL1, bBL1, BL2, bBL2, . . . are changed in accordance with the state of the magneto-resistive element 11.

In the second embodiment, specific memory cells in a memory cell array are used as dummy cells to generate a reference potential Vref. For example, a specific one of a plurality of memory cells connected to one bit line is used as a dummy cell DUMMY.

Like the memory cell MC, a dummy cell DUMMY is comprised of one magneto-resistive element 11 and one MOS transistor 12. Dummy write word lines DWWL1, DWWL2, . . . and dummy read word lines DRWL1, DRWL2, . . . extend in the row direction. The bit lines BL1, bBL1, BL2, bBL2, . . . are commonly connected to memory cells MC and dummy cells DUMMY.

The dummy write word lines DWWL1, DWWL2, . . . have no nodes on the memory cell array and are arranged to run near the magneto-resistive elements 11 in the dummy cells DUMMY. That is, in write operation, the magnetization directions (parallel, anti-parallel) of the magneto-resistive elements 11 in the dummy cells DUMMY are changed by using the magnetic fields generated by currents flowing in the dummy write word lines DWWL1, DWWL2, . . . and bit lines BL1, bBL1, BL2, bBL2, . . . .

The dummy read word lines DRWL1, DRWL2, . . . are connected to the gates of the MOS transistors 12 as elements of memory cells MC. In a read operation, the MOS transistor 12 of the selected dummy cell DUMMY is turned on to supply a constant current to the magneto-resistive element 11 of the selected dummy cell DUMMY, and the potentials of the bit lines BL1, bBL1, BL2, bBL2, . . . are changed in accordance with the state of the magneto-resistive element 11.

In this example, with regard to one bit line (BLi) of each pair of bit lines. BLi and bBLi, "0"-data are stored in the dummy cells DUMMY connected to odd-numbered bit lines BL1, ..., and "1"-data are stored in the dummy cells DUMMY connected to the even-numbered bit lines BL2, ....

The odd-numbered bit lines BL1, ... and even-numbered bit lines BL2, ... are connected to each other through equalize circuits (short-circuiting N-channel MOS transistors) 26. More specifically, the bit lines BL1 and BL2 are connected to each other through a short-circuiting N-channel MOS transistor QN10. Likewise, other corresponding bit lines are connected to each other through additional short-circuiting N-channel MOS transistors.

The short-circuiting N-channel MOS transistor QN10 is controlled by a control signal EQL0.

With regard to the other bit line (bBLi) of each pair of bit lines BLi and bBLi, "0"-data are stored in the dummy cells DUMMY connected to the odd-numbered bit lines bBL1, ..., and "1"-data are stored in the dummy cells DUMMY connected to the even-numbered bit lines bBL2, ....

The odd-numbered bit lines bBL1, ... and even-numbered bit lines bBL2, ... are connected to each other through the equalize circuits (short-circuiting N-channel MOS transistors) 26. More specifically, the bit lines bBL1 and bBL2 are connected to each other through a short-circuiting N-channel MOS transistor QN11. Likewise, other corresponding bit lines are connected to each other through additional N-channel MOS transistors.

The short-circuiting N-channel MOS transistor QN11 is ON/OFF-controlled by a control signal EQL1.

Note that the relationship between the data stored in dummy cells DUMMY and the bit lines short-circuited to each other is not limited to the above relationship, and can be variously changed.

It is important that the bit lines BLi or bit lines bBLi be short-circuited to each other, and half of 2×n (n is a natural number) dummy cells DUMMY connected to 2×n bit lines that are short-circuited store "0"-data, and the remaining cells store "1"-data.

A precharge circuit 23 serves to precharge all the bit lines BLi and bBLi to a precharge potential VPC in a standby state. Even if the precharge potential VPC is the ground potential, no problem arises in terms of operation. If, however, the precharge potential VPC is the ground potential, problems are posed in terms of data read speed and power consumption. For this reason, the precharge potential VPC is preferably set to an appropriate potential.

More specifically, if the precharge potential VPC is the ground potential, for example, the following problems arise the in sense operation: a. it takes much time until the potential of a bit line sufficiently rises to apply a sufficient bias to a memory cell, and data is output from the memory cell; and b. the amplitude of the potential of the bit line increases to waste current in charging/discharging the bit line.

The value of the precharge potential VPC is determined in consideration of the breakdown voltage of a magneto-resistance element, the bias dependence of a magnetic resistance change ratio MR, the ON resistance of a MOS transistor, and the like so as to output a signal with the maximum level within a reliability range.

Only one sense amplifier (S/A) 24 is provided for one pair of bit lines BLi and bBLi (i=1, 2, ...).

In this example, the sense amplifier 24 is based on the differential sense scheme of supplying a constant current Is to the memory cell MC and detecting the potential difference produced between the pair of bit lines BLi and bBLi. In addition, the memory cell array uses the folded bit line scheme.

The memory cell array arrangement shown in FIG. 13 is an example. Obviously, the present invention can be magnetic random access memories having other memory cell array arrangements.

The sense amplifier 24 compares the potential of one of the pair of bit lines BLi and bBLi to which the selected memory cell MC is connected with the potential of the other of the pair of bit lines BLi and bBLi (reference potential Vref), and amplifies the difference.

In a read operation, a read word line enable signal RWLEN is set at "H" level. At this time, an N-channel MOS transistor QN4 is turned on, and an NMOS transistor QN5 is turned off. An output signal Vbias from the bias voltage generating circuit 21 is therefore transferred to the gate of a P-channel MOS transistor QP2.

The sense current Is flows in all the bit lines BL1, bBL1, BL2, bBL2, ..., and the potentials of the bit lines BL1, bBL1, BL2, bBL2, ... change in accordance with the data in the selected memory cell MC or the data in the selected dummy cell DUMMY.

Note that since the potentials of the bit lines to which the dummy cells DUMMY are connected are equalized by an equalize circuit 26, Vref (=(V0+V1)/2) is obtained.

Figure 14:
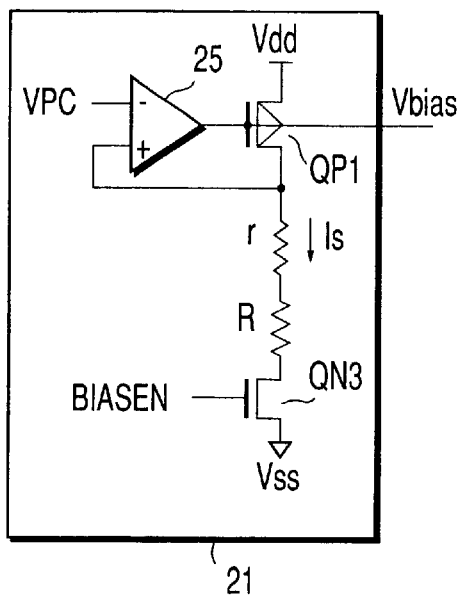
FIG. 14 is a circuit diagram showing an example of a bias voltage generating circuit.

FIG. 14 shows an example of the bias voltage generating circuit in FIG. 13.

As a magneto-resistance element R and N-channel MOS transistor QN3, elements having the same layouts and sizes as those of the magneto-resistive element 11 and MOS transistor 12 in the memory cell MC are used.

In the second embodiment, it is most preferable that the magneto-resistance element R be identical to, for example, the magneto-resistive element 11 in the memory cell MC. However, the precision of the output signal Vbias from the bias voltage generating circuit 21 is not very significant, the magneto-resistance element may be replaced with another element.

The size of a P-channel MOS transistor QP1 having a gate to which the output signal Vbias from a differential amplifier 25 is input is substantially equal to that of the P-channel MOS transistor QP2 and a P-channel MOS transistor bQP2 of a sense current source 22 and the N-channel MOS transistor 12 of the memory cell MC.

The P-channel MOS transistor QP1 in the bias voltage generating circuit and the P-channel MOS transistors QP2 and bQP2 of the sense current source 22 constitute a current mirror circuit.

In a read operation, the sense current Is flows in the magneto-resistance element R in the bias voltage generating circuit 21 and also flows in one of the pair of bit lines BLi and bBLi (i=1, 2, ...) At this time, since interconnection resistances exist in the bit lines BLi and bBLi, the potentials of the bit lines drop. As a consequence, the potential differences among sense amplifier nodes N1, bN1, N2, bN2, ... change depending on the position of the selected memory cell MC.

If, for example, access is made to the memory cell MC nearest to the sense amplifier (S/A) 24, the influences of the interconnection resistances of the bit lines BLi and bBLi are minimized. If access is made to the memory cell MC located farthest from the sense amplifier (S/A) 24, the influence of the interconnection resistances of the bit lines BLi and bBLi is maximized.

The position of a selected memory cell, i.e., the potential differences among the sense amplifier nodes N1, bN1, N2, bN2, . . . due to the interconnection resistances of the bit lines BLi and bBLi become noise in sensing the data in the memory cell MC.

In order to reduce noise in such sense operation, according to the embodiment, as shown in FIG. 14, an adjusting resistor r having a resistance value ½ that of the interconnection resistance of the bit lines BLi and bBLi is connected between the P-channel MOS transistor QP1 and the magneto-resistance element R. The simplest method of forming the adjusting resistor r, is to form an interconnection having a cross-sectional area equal to each of the bit lines BLi and bBLi and a length ½ that thereof by using the same interconnection layer as that for each of the bit lines BLi and bBLi.

If no row access is made, i.e., the read word lines RWL1, RWL2, . . . are not selected, and a current is supplied to the bias current generating circuit 21, the current is wasted. This interferes with a reduction in current consumption.

For this reason, a bias enable signal BIASEN is set at "H" level (e.g., a potential equal to the potential to be applied to the selected read word line) only for a period during which row access is made, and is set at "L" level (e.g., the ground potential) for other periods.

With this operation, an N-channel MOS transistor QN3 is kept on for only a period during which row access is made. This makes it possible to prevent a current from being wasted in the bias generating circuit, contributing to a reduction in current consumption.

Figure 15:
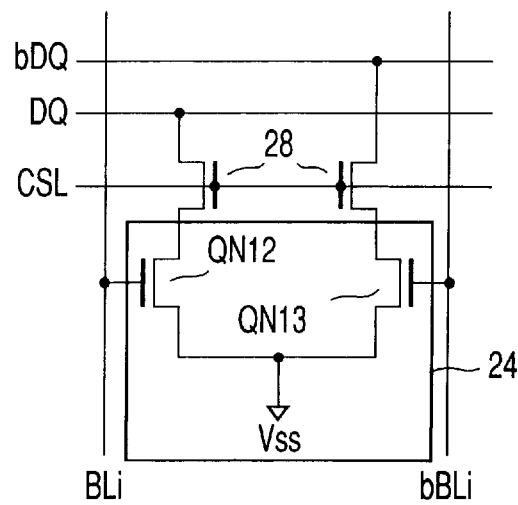
FIG. 15 is a circuit diagram showing an example of a sense amplifier.

FIG. 15 shows an example of the sense amplifier in FIG. 13.

This sense amplifier 24 is a sense amplifier used in the so-called direct sense scheme. The potentials of the pair of bit lines BLi and bBLi are respectively input to the gates of N-channel MOS transistors QN12 and QN13. That is, the potential difference between the pair of bit lines BLi and bBLi appears as the current driving capability difference between the N-channel MOS transistors QN12 and QN13.

The sense amplifier 24 senses and amplifies the potential difference between the bit lines BLi and bBLi. That is, the data in the selected memory cell MC is sensed by the sense amplifier 24 first, and then transferred to a pair of data lines (a pair of DQ lines) DQ and bDQ.

Note that selection of a column, i.e., electric connection between the sense amplifier 24 and the pair of data lines DQ and bDQ is performed by ON/OFF-controlling a column select switch 28 using a column select signal CSL.

A sense operation in a read operation in the magnetic random access memory shown in FIGS. 13 to 15 will be described next with reference to the timing chart of FIG. 16.

For the sake of simplicity, assume that in the following description, the read word line RWL1 is selected, and the data in the memory cell MC is read out to the bit line BL1, and when the read data is "0", the potential of the bit line BL1 is slightly raised from the precharge potential VPC, and when the read data is "1", the potential of the bit line BL1 greatly rises from the precharge potential VPC. In this description, the variation of the potential of the bit line BL1 to VPC is small, and the memory has a low power.

First of all, the bit lines BLi and bBLi are precharged before a sense operation. In precharge operation, the precharge signal PC is set at "L" level (e.g., the ground potential), and hence all the pairs of bit lines BLi and bBLi are precharged to VPC.

When the precharge signal PC is set at "H" level (e.g., the internal power supply potential) afterward, the precharged states of the pair of bit lines BLi and bBLi are canceled.

When the read word line enable signal RWLEN is set at "H" level, the read word line RWL1 is set at "H" level by the read word line driver. In addition, in this example, the dummy read word line DRWL2 is set at "H" level at the same time when the read word line RWL1 is set at "H" level.

At the same time, the N-channel MOS transistor QN4 in FIG. 13 is turned on. As a consequence, the bias potential Vbias output from the bias voltage generating circuit 21 is transferred to the P-channel MOS transistor QP2, and the sense current Is flows in all the pairs of bit lines BL1, bBL1, BL2, bBL2, . . . by a current mirror.

Figure 16:
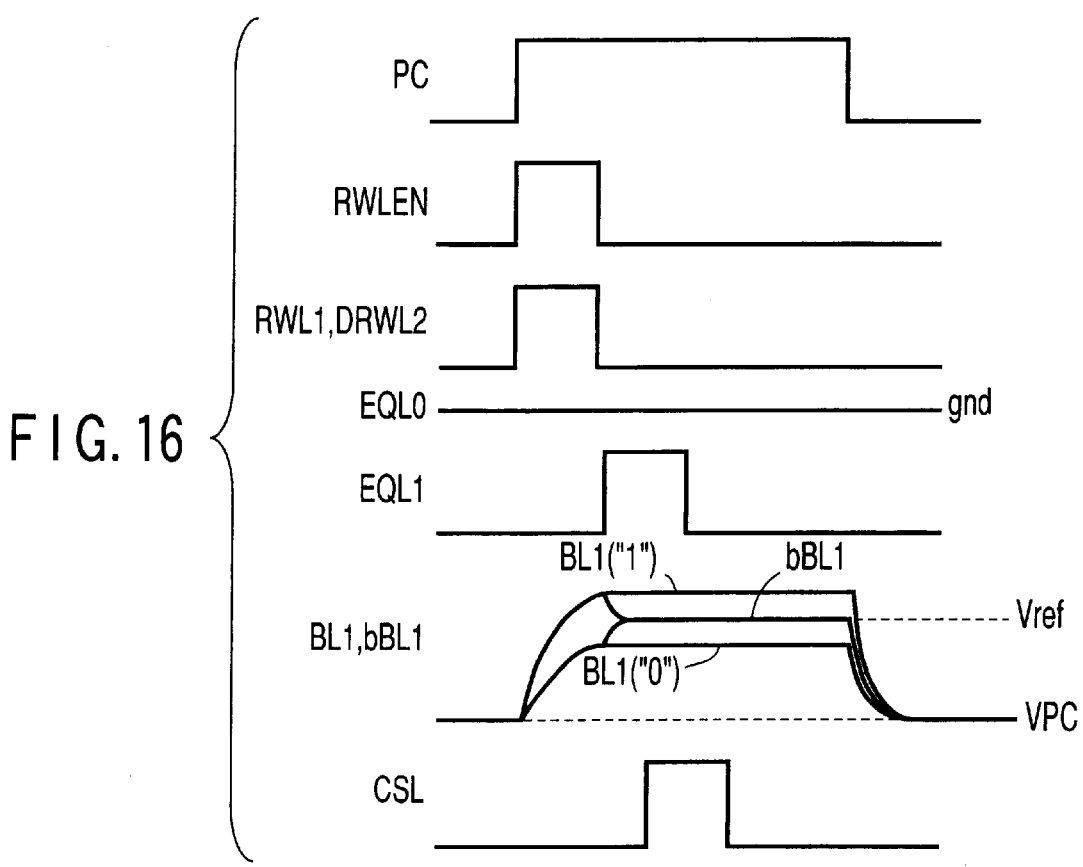
FIG. 16 is a timing chart showing the sense operation of the MRAM having the elements shown in FIGS. 13 to 15.

If, therefore, the data stored in the selected memory cell MC or dummy cell DUMMY is "0", the potential of the bit line BL1 is slightly raised from the precharge potential VPC, as shown in FIG. 16. If the data stored in the selected memory cell MC or dummy cell DUMMY is "1", the potential of the bit line BL1 greatly rises from the precharge potential VPC.

Note that the dummy cells DUMMY are preferably arranged at the middle portions of the bit lines BL1, bBL1, BL2, bBL2, . . . to equalize noise due to the interconnection resistances (or potential drops) of the bit lines BL1, bBL1, BL2, bBL2, . . . .

In this example, since the read word line RWL1 and dummy read word line DRWL2 are selected, the potentials of the bit lines BL1, BL2, . . . change in accordance with the data stored in the memory cell MC, and the potentials of the bit lines bBL1, bBL2, . . . change in accordance with the data stored in the dummy cell DUMMY.

In this case, "0"-data is stored in the dummy cell DUMMY connected to the bit line bBL1, and "1"-data is stored in the dummy cell DUMMY connected to the bit line bBL2.

After the potential of each of the bit lines BL1, bBL1, BL2, bBL2, . . . sufficiently changes in accordance with the data stored in the memory cell MC or dummy cell DUMMY, the potential of the read word line enable signal RWLEN changes from "H" level to "L" level, and the potentials of the read word line RWL1 and dummy read word line DRWL2 also change from "H" level to "L" level.

As a result, the sense current Is flowing in each of the bit lines BL1, bBL1, BL2, bBL2, . . . stops, and each of the bit lines BL1, bBL1, BL2, bBL2, . . . is set in a floating state while holding a value corresponding to the data stored in the memory cell MC or dummy cell DUMMY.

The control signal EQL1 is then set at "H" level to turn on the N-channel MOS transistor QN11 in the equalize circuit 26, thereby short-circuiting the bit lines bBL1 and bBL2 to which the data in the selected dummy cell DUMMY is output. As a consequence, charge is shared between the two bit lines bBL1 and bBL2, and both the potentials of the bit lines bBL1 and bBL2 become an optimal intermediate potential (=(V0+V1)/2) as a reference potential.

More specifically, the "0"-data stored in the dummy cell DUMMY is output to the bit line bBL1 to set the bit line at V0 and the "1"-data stored in the dummy cell DUMMY is output to the bit line bBL2 to set the bit line at V1. By setting the control signal EQL1 at "H" level, therefore, both the potentials of the bit lines bBL1 and bBL2 are set at an intermediate potential (=(V0+V1)/2).

A charge sharing operation is performed by the equalize circuit 26 while the sense current Is flowing in the bit lines BL1, bBL1, BL2, bBL2, . . . is interrupted, and the bit lines BL1, bBL1, BL2, bBL2, . . . are set in a floating state to trap the data in the bit lines BL1, bBL1, BL2, bBL2, . . . . Therefore, a reference potential Vref to be generated does not vary regardless of the equalizing timing.

After the reference potential Vref is generated at each of the bit lines bBL1, bBL2, . . . , the potential difference between the pair of bit lines BL1 and bBL1 can be transferred as the difference between currents flowing in the pair of data lines (the pair of DQ lines) DQ and bDQ through the sense amplifiers 24 by setting the column select signal CSL at "H" level.

In this example, since the sense amplifiers based on the direct sense scheme are used, a circuit for directly sensing the current difference between the pair of data lines DQ and bDQ or a circuit for converting this current difference into a potential difference again and sensing a voltage must be connected to the pair of data lines DQ and bDQ.

Finally, the precharge signal PC is set at "L" level again to set all the bit lines BL1, bBL1, BL2, bBL2, . . . to the precharge potential VPC to prepare for the next read cycle.

In the above sense operation, a restore operation like that performed in a DRAM is not performed for the following reason. Since a magnetic random access memory (MRAM) is capable of a nondestructive data read, the data need not be rewritten in the memory cell. Therefore, the potentials of the pair of bit lines BL1 and bBL1 need not go full swing for data restore operation.

In addition, since the potentials of the pair of bit lines BL1 and bBL1 need not go full swing after data sensing, the amount of charge required for charging/discharging of the pair of bit lines BL1 and bBL1 decreases, contributing to a reduction in power consumption. In addition, since this can prevent a high voltage from being applied to a magneto-resistance element (TMR element), the reliability of the magneto-resistance element can be improved.

Furthermore, since no restore operation is required, after the data in the memory cell MC is sufficiently output to the bit line BL1, the potentials of the selected read word line RWL1 and selected dummy read word line DRWL2 can be quickly dropped from "H" level to "L" level.

That is, since the potential level of the read word line RWL1 and dummy read word line DRWL2 need not be raised for data restore operation, the potential level of the read word line RWL1 and dummy read word line DRWL2 can be lowered to stop the sense current Is flowing in the bit line BL1 immediately after the data is output to the bit line BL1. This makes it possible to eliminate power wastage and attain a reduction in power consumption.

As described above, in a magnetic random access memory (MRAM), since an nondestructive read operation is performed, no restore operation is required, and the potentials of a pair of bit lines need not go full swing. The bit lines and the sense amplifiers can be precharged independently. Therefore, as for read operation, the magnetic random access memory can realize high-speed random access with low power consumption as compared with the DRAM.

SECOND EXAMPLE

As compared with the magnetic random access memory according to the first example described above, a magnetic random access memory (MRAM) according to the second example has the following characteristic features. First, this memory has an isolate circuit (isolate transistor) for electrically connecting/disconnecting a pair of bit lines BLi and bBLi to/from a sense amplifier S/A. Second, each sense amplifier has a flip-flop type arrangement like a sense amplifier used for a general DRAM.

The magnetic random access memory according to this example will be described in detail below.

Figure 17:
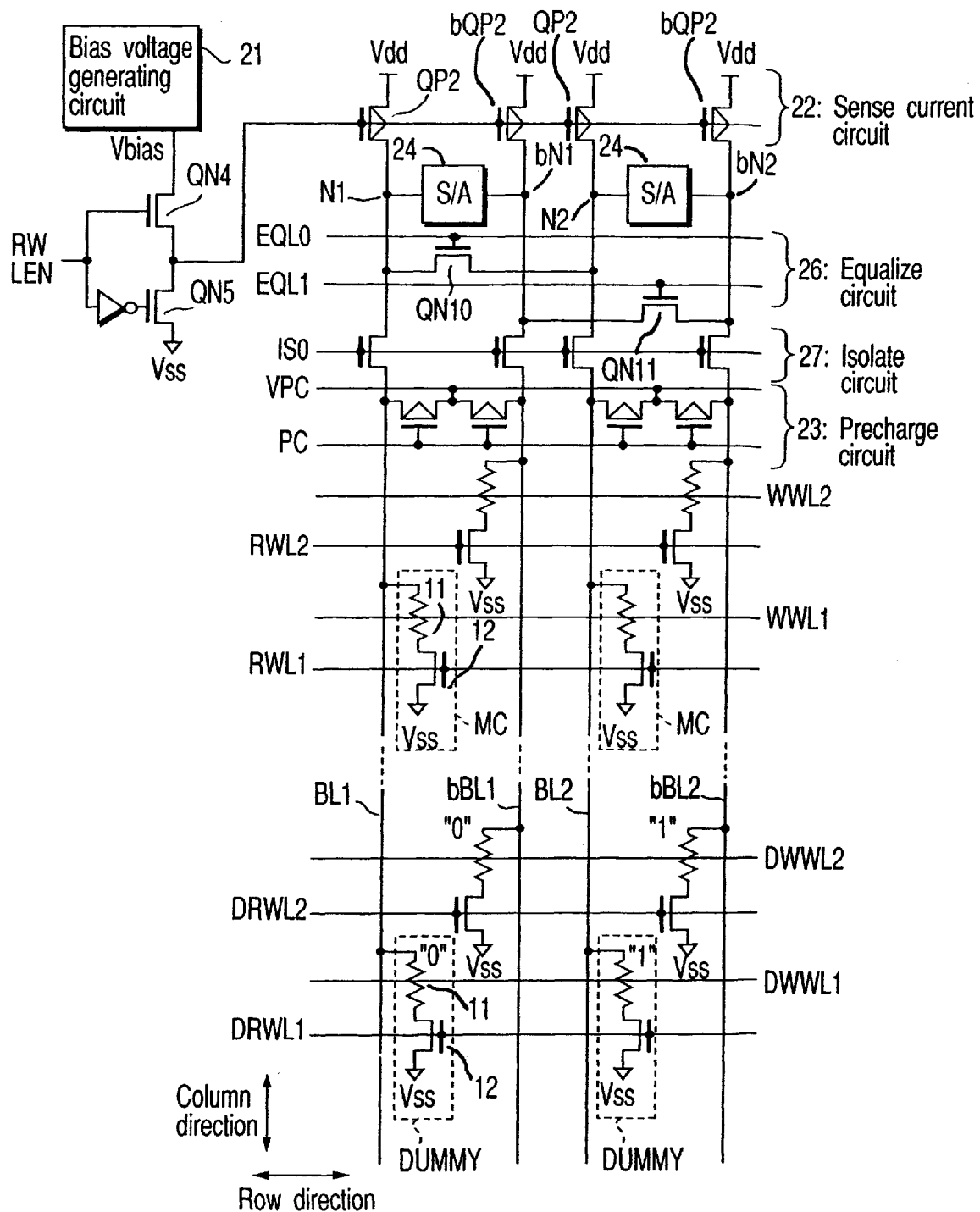
FIG. 17 is a circuit diagram showing the main part of the MRAM according to the second example of the second embodiment.

FIG. 17 shows the main part of a magnetic random access memory according to the second example of the second embodiment.

A memory cell MC is comprised of one magneto-resistive element 11 and one MOS transistor 12. Write word lines WWL1, WWL2, . . . and read word lines RWL1, RWL2, . . . extend in the row direction, and bit lines BL1, bBL1, BL2, bBL2, . . . extend in the column direction.

The write word lines WWL1, WWL2, . . . have no nodes on the memory cell array and are arranged to run near the magneto-resistive elements 11. That is, in write operation, the magnetization directions (parallel, anti-parallel) of the magneto-resistive elements 11 are changed by using the magnetic fields generated by currents flowing in the write word lines WWL1, WWL2, . . . and bit lines BL1, bBL1, BL2, bBL2, . . . .

The read word lines RWL1, RWL2, . . . are connected to the gates of the MOS transistors 12 as elements of memory cells MC. In read operation, the MOS transistor 12 of the selected memory cell MC is turned on to supply a constant current to the magneto-resistive element 11 of the selected memory cell MC, and the potentials of the bit lines BL1, bBL1, BL2, bBL2, . . . are changed in accordance with the state of the magneto-resistive element 11.

In this example, as in the first example described above, specific memory cells in a memory cell array are used as dummy cells to generate a reference potential Vref. For example, a specific one of a plurality of memory cells connected to one bit line is used as a dummy cell DUMMY.

Like the memory cell MC, a dummy cell DUMMY is comprised of one magneto-resistive element 11 and one MOS transistor 12. Dummy write word lines DWWL1, DWWL2, . . . and dummy read word lines DRWL1, DRWL2, . . . extend in the row direction. The bit lines BL1, bBL1, BL2, bBL2, . . . are commonly connected to memory cells MC and dummy cells DUMMY.

The dummy write word lines DWWL1, DWWL2, . . . have no nodes on the dummy cell array and are arranged to run near the magneto-resistive elements 11 in the dummy cells DUMMY. That is, in a write operation, the magnetization directions (parallel, anti-parallel) of the magneto-resistive elements 11 in the dummy cells DUMMY are changed by using the magnetic fields generated by currents flowing in the dummy write word lines DWWL1, DWWL2, . . . and bit lines BL1, bBL1, BL2, bBL2, . . . .

The dummy read word lines DRWL1, DRWL2, . . . are connected to the gates of the MOS transistors 12 as elements of dummy cells DUMMY. In read operation, the MOS transistor 12 of the selected dummy cell DUMMY is turned on to supply a constant current to the magneto-resistive element 11 of the selected dummy cell DUMMY, and the potentials of the bit lines BL1, bBL1, BL2, bBL2, . . . are changed in accordance with the state of the magneto-resistive element 11.

In this example, with regard to one bit line (BLi) of each pair of bit lines BLi and bBLi, "0"-data are stored in the dummy cells DUMMY connected to odd-numbered bit lines BL1, . . . , and "1"-data are stored in the dummy cells DUMMY connected to the even-numbered bit lines BL2, . . . .

The odd-numbered bit lines BL1, ... and even-numbered bit lines BL2, ... are connected to each other through equalize circuits (short-circuiting N-channel MOS transistors) 26. More specifically, the bit lines BL1 and BL2 are connected to each other through a short-circuiting N-channel MOS transistor QN10. Likewise, the other corresponding bit lines are connected to each other through additional short-circuiting N-channel MOS transistors.

The short-circuiting N-channel MOS transistor QN10 is controlled by a control signal EQL0.

With regard to the other bit line (bBLi) of each pair of bit lines BLi and bBLi, "0"-data are stored in the dummy cells DUMMY connected to the odd-numbered bit lines bBL1, ..., and "1"-data are stored in the dummy cells DUMMY connected to the even-numbered bit lines bBL2, ....

The odd-numbered bit lines bBL1, ... and even-numbered bit lines bBL2, ... are connected to each other through the equalize circuits (short-circuiting N-channel MOS transistors) 26. More specifically, the bit lines bBL1 and bBL2 are connected to each other through a short-circuiting N-channel MOS transistor QN11. Likewise, other corresponding bit lines are connected to each other through additional N-channel MOS transistors.

The short-circuiting N-channel MOS transistor QN11 is ON/OFF-controlled by a control signal EQL1.

Note that the relationship between the data stored in dummy cells DUMMY and the bit lines short-circuited to each other is not limited to the above relationship, and can be variously changed.

It is important that the bit lines BLi or bit lines bBLi be short-circuited to each other, and half of 2×n (n is a natural number) dummy cells DUMMY connected to 2×n bit lines that are short-circuited store "0"-data, and the remaining cells store "1"-data.

A precharge circuit 23 serve to precharge all the bit lines BLi and bBLi to a precharge potential VPC in a standby state. Even if the precharge potential VPC is the ground potential, no problem arises in terms of operation. If, however, the precharge potential VPC is the ground potential, problems are posed in terms of data read speed and power consumption. For this reason, the precharge potential VPC is preferably set to an appropriate potential.

More specifically, if the precharge potential VPC is the ground potential, for example, the following problems arise in a sense operation: a. it takes much time until the potential of a bit line sufficiently rises to apply a sufficient bias to a memory cell, and data is output from the memory cell; and b. the amplitude of the potential of the bit line increases to waste current in charging/discharging the bit line.

The value of the precharge potential VPC is determined in consideration of the breakdown voltage of a magneto-resistance element, the bias dependence of a magnetic resistance change ratio MR, the ON resistance of a MOS transistor, and the like so as to output a signal with the maximum level within a reliability range.

Only one sense amplifier (S/A) 24 is provided for one pair of bit lines BLi and bBLi (i=1, 2, ... ).

In this example, the sense amplifier 24 is based on the differential sense scheme of supplying a constant current Is to the memory cell MC and detecting the potential difference produced between the pair of bit lines BLi and bBLi. In addition, the memory cell array uses the folded bit line scheme.

The memory cell array arrangement shown in FIG. 17 is an example. Obviously, the present invention can be magnetic random access memories having other memory cell array arrangements.

The sense amplifier 24 compares the potential of one of the pair of bit lines BLi and bBLi to which the selected memory cell MC is connected with the potential of the other of the pair of bit lines BLi and bBLi (reference potential Vref), and amplifies the difference.

In this example, an isolate circuit 27 formed by an N-channel MOS transistor is connected between the pair of bit lines BLi and bBLi and sense amplifier (S/A) 24.

After the potentials of the sense amplifier nodes Ni and bNi sufficiently change in accordance with the data in the memory cell MC or dummy cell DUMMY, the isolate circuit 27 electrically disconnects the pair of bit lines BLi and bBLi from the sense amplifier 24, thus disconnecting the parasitic capacitances produced in the pair of bit lines BLi and bBLi from the sense amplifier 24 in amplifying operation.

Since the isolate circuit 27 is connected between the pair of bit lines BLi and bBLi and the sense amplifier 24, the precharge circuit 23 is located closer to the pair of bit lines BLi and bBLi than the isolate circuit 27. An equalize circuit 26 is located closer to the sense amplifier 24 than the isolate circuit 27. After the isolate circuit 27 electrically disconnects the pair of bit lines BLi and bBLi from the sense amplifier 24, the equalize circuit 26 short-circuits the bit line BLi and the bit line BLi+1 or the bit line bBLi and the bit line bBLi+1 to generate the intermediate potential Vref.

In a read operation, a read word line enable signal RWLEN is set at "H" level. At this time, an N-channel MOS transistor QN4 is turned on, and an NMOS transistor QN5 is turned off. An output signal Vbias from the bias voltage generating circuit 21 is therefore transferred to the gate of a P-channel MOS transistor QP2.

The sense current Is flows in all the bit lines BL1, bBL1, BL2, bBL2, ..., and the potentials of the bit lines BL1, bBL1, BL2, bBL2, ... change in accordance with the data in the selected memory cell MC or the data in the selected dummy cell DUMMY.

Note that since the potentials of the bit lines to which the dummy cells DUMMY are connected are equalized by the equalize circuit 26, Vref (=(V0+V1)/2) is obtained.

Figure 18:
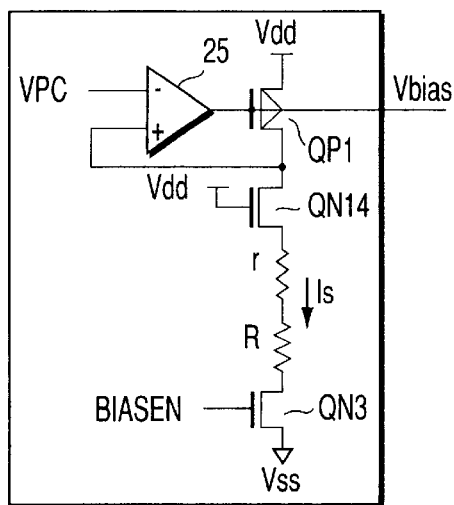
FIG. 18 is a circuit diagram showing an example of a bias voltage generating circuit.

FIG. 18 shows an example of the bias voltage generating circuit in FIG. 17.

As a magneto-resistance element R and N-channel MOS transistor QN3, elements having the same layouts and sizes as those of the magneto-resistive element 11 and MOS transistor 12 in the memory cell MC are used.

In the second embodiment, it is most preferable that the magneto-resistance element R be identical to the magneto-resistive element 11 in the memory cell MC. However, the precision of the output signal Vbias from the bias voltage generating circuit 21 is not very significant, the magneto-resistance element may be replaced with another element.

The size of a P-channel MOS transistor QP1 having a gate to which the output signal Vbias from a differential amplifier 25 is input is substantially equal to that of the P-channel MOS transistor QP2 and a P-channel MOS transistor bQP2 of a sense current source 22 and the N-channel MOS transistor 12 of the memory cell MC.

The P-channel MOS transistor QP1 in the bias voltage generating circuit and the P-channel MOS transistors QP2 and bQP2 of the sense current source 22 constitute a current mirror circuit.

In a read operation, the sense current Is flows in the magneto-resistance element R in the bias voltage generating circuit 21 and also flows in one of the pair of bit lines BLi and bBLi (i=1, 2, . . . ) At this time, since interconnection resistances exist in the bit lines BLi and bBLi, the potentials of the bit lines drop. As a consequence, the potential differences among sense amplifier nodes N, bN1, N2, bN2, . . . . change depending on the position of the selected memory cell MC.

If, for example, access is made to the memory cell MC nearest to the sense amplifier (S/A) 24, the influence of the interconnection resistances of the bit lines BLi and bBLi is minimized. If access is made to the memory cell MC located farthest from the sense amplifier (S/A) 24, the influence of the interconnection resistances of the bit lines BLi and bBLi is maximized.

The position of a selected memory cell, i.e., the potential differences among the sense amplifier nodes N1, bN1, N2, bN2, . . . due to the interconnection resistances of the bit lines BLi and bBLi become noise in sensing the data in the memory cell MC.

In order to reduce noise in such a sense operation, according to the embodiment, an adjusting resistor r having a resistance value ½ that of the interconnection resistance of the bit lines BLi and bBLi is connected between the P-channel MOS transistor QP1 and the magneto-resistance element R. According to the simplest method of forming the adjusting resistor r, an interconnection having a cross-sectional area equal to each of the bit lines BLi and bBLi and a length ½ that thereof by using the same interconnection layer as that for each of the bit lines BLi and bBLi.

Figure 19:
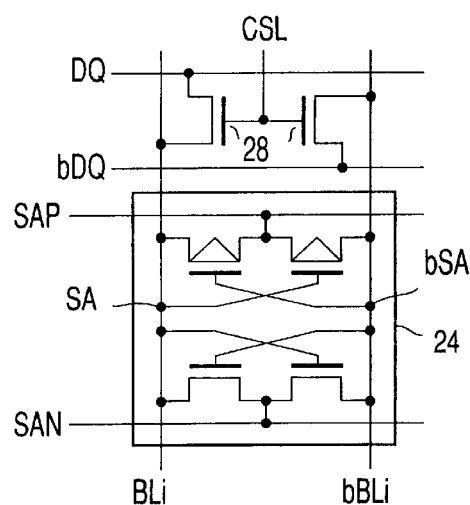
FIG. 19 is a circuit diagram showing an example of a sense amplifier.

In this example, as shown in FIGS. 17–19, the isolate circuit (N-channel MOS transistor) 27 is connected between the sense amplifier 24 and the pair of bit lines BLi and bBLi. In the bias voltage generating circuit 21 as well, therefore, a P-channel MOS transistor PQ14 identical to the N-channel MOS transistor of the isolate circuit 27 is connected between the P-channel MOS transistor (step-down transistor) QP1 and the resistive element r.

If no row access is made, i.e., the read word lines RWL1, RWL2, . . . are not selected, and a current is supplied to the bias current generating circuit, the current is wasted. This interferes with a reduction in current consumption.

For this reason, a bias enable signal BIASEN is set at "H" level (e.g., a potential equal to the potential to be applied to the selected read word line) only for a period during which row access is made, and is set at "L" level (e.g., the ground potential) for other periods.

With this operation, an N-channel MOS transistor QN3 is kept on for only a period during which row access is made. This makes it possible to prevent a current from being wasted in the bias generating circuit, contributing to a reduction in current consumption.

FIG. 19 shows an example of the sense amplifier in FIG. 17.

This sense amplifier 24 is a flip-flop sense amplifier often used for a DRAM. The sense amplifier 24 is comprised of two CMOS inverters driven by SAP (e.g., an internal power supply potential Vdd) and SAN (e.g., a ground potential Vss).

The sense amplifier 24 senses and amplifies the potential difference between the bit lines BLi and bBLi. That is, the data in the selected memory cell MC is sensed by the sense amplifier 24 first, and then transferred to a pair of data lines (a pair of DQ lines) DQ and bDQ.

Note that selection of a column, i.e., electric connection between the-sense amplifier 24 and the pair of data lines DQ and bDQ is performed by ON/OFF-controlling a column select switch 28 using a column select signal CSL.

A sense operation in a read operation in the magnetic random access memory shown in FIGS. 17 to 19 will be described next with reference to the timing chart of FIG. 20.

For the sake of simplicity, assume that in the following description, the read word line RWL1 is selected, and the data in the memory cell MC is read out to the bit line BL1.

First of all, the pair of bit lines BLi and bBLi are precharged before sense operation. In precharge operation, a precharge signal PC is set at "L" level (e.g., the ground potential), and hence all the pairs of bit lines BLi and bBLi are precharged to VPC.

At this time, a control signal ISO is set at "H" level (e.g., the internal power supply potential Vdd), and the pair of bit lines BLi and bBLi and the sense amplifier 24 are electrically connected to each other. The sense amplifier nodes Ni and bNi are therefore precharged to VPC as well. The sense amplifier activation signals SAP and SAN are also precharged to VPC.

When the precharge signal PC is set at "H" level (e.g., the internal power supply potential) afterward, the precharged states of the pair of bit lines BLi and bBLi are canceled.

When the read word line enable signal RWLEN is set at "H" level, the read word line RWL1 is set at "H" level by the read word line driver. In addition, in this example, the dummy read word line DRWL2 is set at "H" level at the same time when the read word line RWL1 is set at "H" level.

At the same time, the N-channel MOS transistor QN4 in FIG. 17 is turned on. As a consequence, the bias potential Vbias output from the bias voltage generating circuit 21 is transferred to the P-channel MOS transistor QP2, and the sense current Is flows in all the pairs of bit lines BL1, bBL1, BL2, bBL2, . . . by a current mirror.

Figure 20:
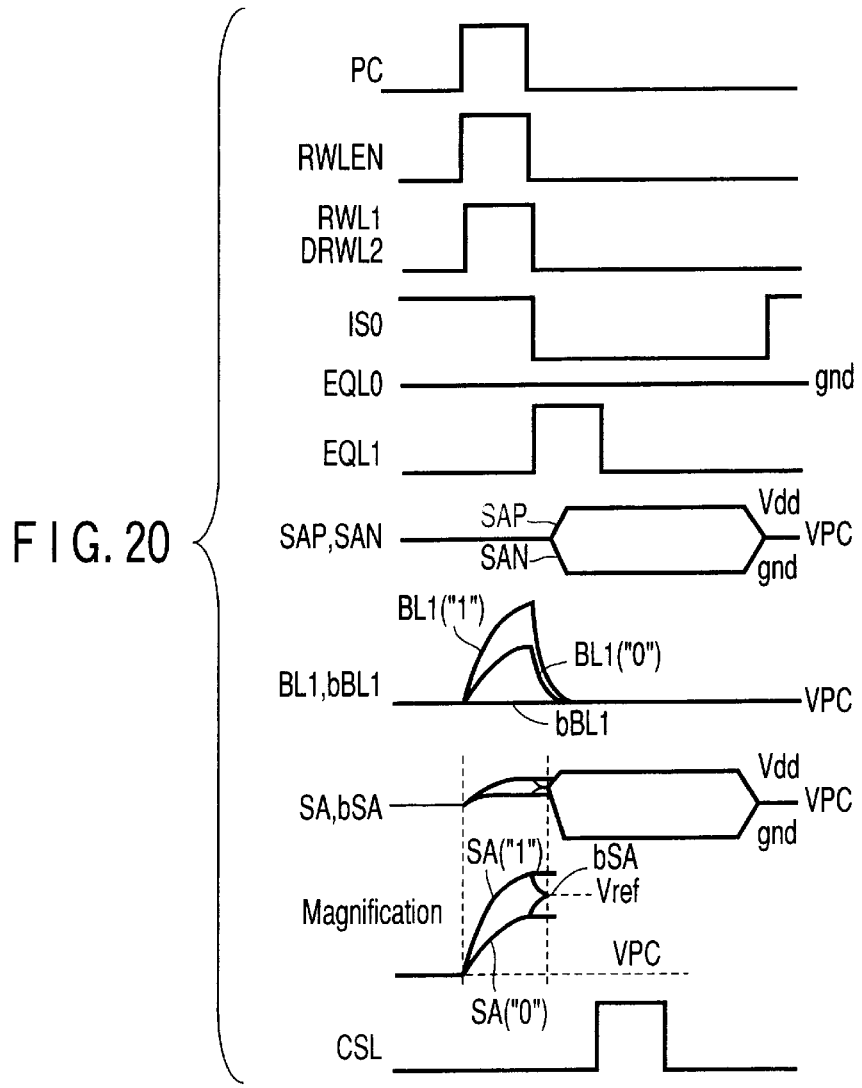
FIG. 20 is a timing chart showing the sense operation of the MRAM having the elements shown in FIGS. 17 to 19.

If, therefore, the data stored in the selected memory cell MC or dummy cell DUMMY is "0", the potential of the bit line BL1 is kept at the precharge potential VPC or slightly raised from the precharge potential VPC, as shown in FIG. 20. If the data stored in the selected memory cell MC or dummy cell DUMMY is "1", the potential of the bit line BL1 greatly rises from the precharge potential VPC.

Note that the dummy cells DUMMY are preferably arranged at the middle portions of the bit lines BL1, bBL1, BL2, bBL2, . . . to equalize noise due to the interconnection resistances (or potential drops) of the bit lines BL1, bBL1, BL2, bBL2, . . . .

In this example, since the read word line RWL1 and dummy read word line DRWL2 are selected, the potentials of the bit lines BL1, BL2, . . . change in accordance with the data stored in the memory cell MC, and the potentials of the bit lines bBL1, bBL2, . . . change in accordance with the data stored in the dummy cell DUMMY.

In this case, "0"-data is stored in the dummy cell DUMMY connected to the bit line bBL1, and "1"-data is stored in the dummy cell DUMMY connected to the bit line bBL2.

After the potential of each of the bit lines BL1, bBL1, BL2, bBL2, . . . sufficiently changes in accordance with the data stored in the memory cell MC or dummy cell DUMMY, the potential of the read word line enable signal RWLEN changes from "H" level to "L" level, and the potentials of the read word line RWL1 and dummy read word line DRWL2 also change from "H" level to "L" level.

As a result, the sense current Is flowing in each of the bit lines BL1, bBL1, BL2, bBL2, . . . stops, and each of the bit lines BL1, bBL1, BL2, bBL2, ... is set in a floating state while holding a value corresponding to the data stored in the memory cell MC or dummy cell DUMMY.

The control signal ISO is then changed to "L" level to electrically disconnect the bit lines BL1, bBL1, BL2, bBL2, ... from the sense amplifier nodes N1, bN1, N2, bN2, ....

In addition, the control signal EQL1 is set at "H" level to turn on the N-channel MOS transistor QN11 in the equalize circuit 26, thereby short-circuiting the bit lines bBLi and bBL2 to which the data in the selected dummy cell DUMMY is output. As a consequence, charge is shared between the two bit lines bBLi and bBL2, and both the potentials of the bit lines bBL1 and bBL2 become an optimal intermediate potential (=(V0+V1)/2) as the reference potential Vref.

More specifically, the "0"-data stored in the dummy cell DUMMY is output to the sense amplifier node bN1 to set the bit line at V0 and the "1"-data stored in the dummy cell DUMMY is output to the sense amplifier node bN2 to set the bit line at V1. By setting the control signal EQL1 at "H" level, therefore, both the potentials of the sense amplifier nodes bN1 and bN2 are set at an intermediate potential (=(V0+V1)/2).

Charge sharing operation is performed by the equalize circuit 26 while the sense current Is flowing in the bit lines BL1, bBL1, BL2, bBL2, ... is interrupted, the sense amplifier nodes N1, bN1, N2, bN2, ... are set in a floating state, and the sense amplifier nodes N1, bN1, N2, bN2, ... are electrically disconnected from the bit lines BL1, bBL1, BL2, bBL2, ....

That is, a charge sharing operation by the equalize circuit 26 is performed while data are trapped in the sense amplifier nodes N1, bN1, N2, bN2, .... Therefore, the generated reference potential Vref does not vary regardless of the equalization timing.

In addition, since equalization is performed while the sense amplifier nodes N1, bNL1, N2, bN2, ... are electrically disconnected from the bit lines BL1, bBL1, BL2, bBL2, ... the intermediate potential Vref can be generated at high speed.

In this case, the precharge circuit 23 is located closer to the bit lines BLi and bBLi than the isolate circuit 27. For this reason, the bit lines BLi and bBLi may be precharged immediately after the control signal ISO is set at "L" level, and the sense amplifier nodes Ni and bNi are disconnected from the bit lines BLi and bBLi.

When equalization is sufficiently performed and the reference potential Vref is generated at the sense amplifier nodes bN1, bN2, ..., the sense amplifier activation signal SAP is set at "H" level (e.g., the internal power supply potential Vdd), and the sense amplifier activation signal SAN is set at "L" level (e.g., the ground potential Vss). The sense amplifier 24 is then operated.

At this time, since the sense amplifier nodes Ni and bNi are electrically disconnected from the bit lines BLi and bBLi, the sense amplifier (S/A) 24 can quickly amplify and latch the potential difference between the sense amplifier nodes Ni and bNi.

When the column select signal CSL is set at "H" level after the data is latched by the sense amplifier 24, the data latched in the sense amplifier 24 is transferred to the output circuit through the pair of data lines (the pair of DQ lines) DQ and bDQ.

Finally, the control signal ISO is set at "H" level again to electrically connect the sense amplifier nodes Ni and bNi to the pair of bit lines BLi and bBLi to precharge the sense amplifier nodes Ni and bNi to VPC, thereby preparing for the next read cycle.

In the above sense operation, restore operation like that performed in a DRAM is not performed for the following reason. Since a magnetic random access memory (MRAM) is capable of a nondestructive data read, the data need not be rewritten in the memory cell. Therefore, the potentials of the pair of bit lines BL1 and bBL1 need not go full swing for data restore operation.

In addition, since the potentials of the pair of bit lines BL1 and bBL1 need not go full swing after data sensing, the amount of charge required for charging/discharging of the pair of bit lines BL1 and bBL1 decreases, contributing to a reduction in power consumption. In addition, since this can prevent a high voltage from being applied to a magneto-resistance element (TMR element), the reliability of the magneto-resistance element can be improved.

Furthermore, since no restore operation is required, after the data in the memory cell MC is sufficiently output to the bit line BL1, the potentials of the selected read word line RWL1 and selected dummy read word line DRWL2 can be quickly dropped from "H" level to "L" level.

That is, the potential level of the read word line RWL1 and dummy read word line DRWL2 need not be raised for a data restore operation. When the potential level of the read word line RWL1 and dummy read word line DRWL2 is lowered, the P-channel MOS transistor comprising the current source turns off and stops the sense current Is flowing in the bit line BL1 immediately after the data is output to the bit line BL1. This makes it possible to eliminate power wastage and attain a reduction in power consumption.

Since the potential difference between the sense amplifier nodes Ni and bNi is amplified by the sense amplifier 24 after the sense amplifier nodes Ni and bNi are electrically disconnected from the bit lines BLi and bBLi by the isolate circuit 27, high-speed data read operation can be realized.

As described above, in a magnetic random access memory (MRAM), since a nondestructive read operation is performed, no restore operation is required, and the potentials of a pair of bit lines need not go full swing. The bit lines and the sense amplifiers can be precharged independently. Therefore, as for the read operation, the magnetic random access memory can realize high-speed random access with low power consumption as compared with the DRAM.

THIRD EXAMPLE

A characteristic feature of a magnetic random access memory (MRAM) according to this example is that a memory cell is comprised of a magneto-resistance element (e.g., a TMR element) and a diode.

Figure 21:
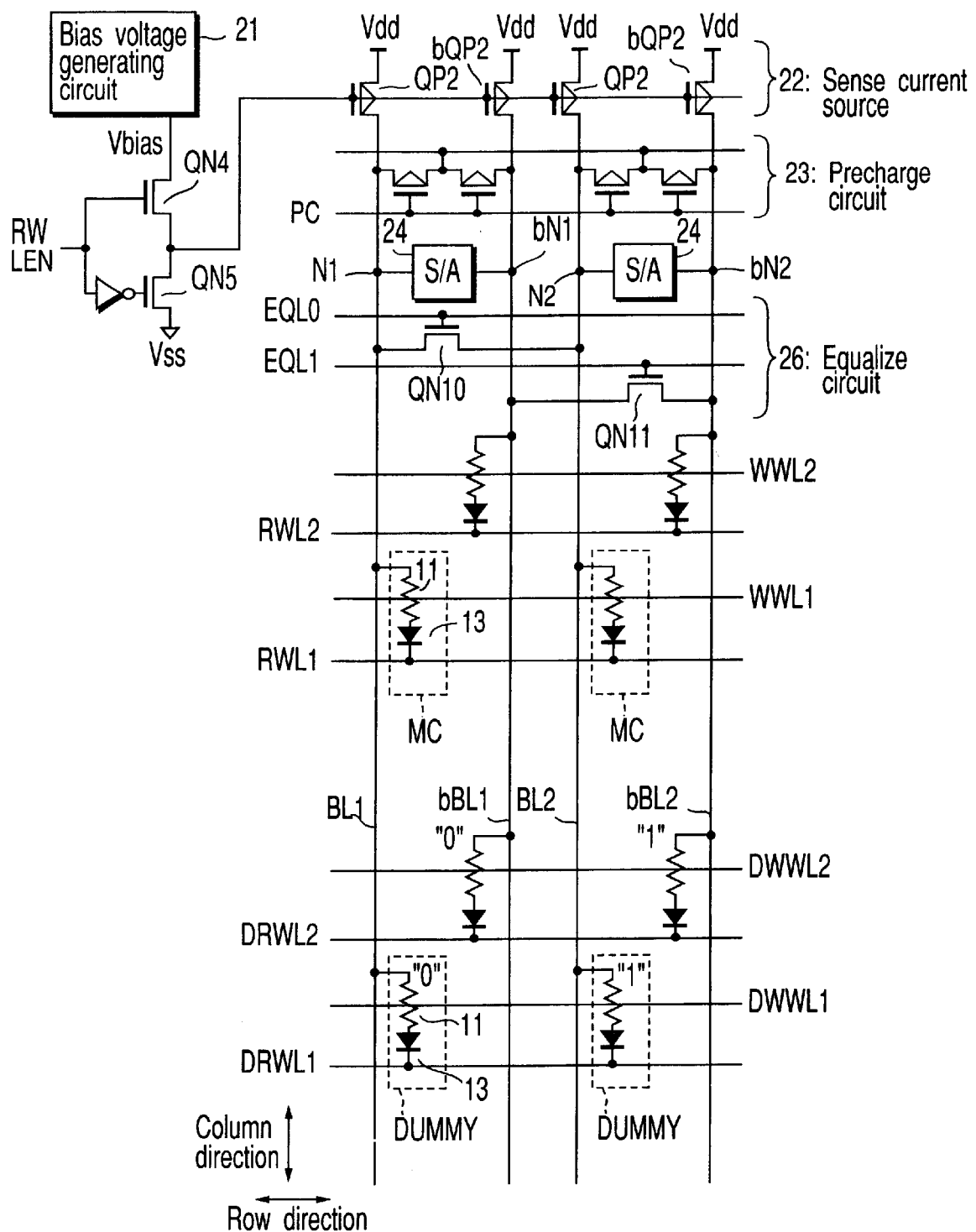
FIG. 21 is a circuit diagram showing the main part of the MRAM according to the third example of the second embodiment.

FIG. 21 shows the main part of a magnetic random access memory according to the third example of the second embodiment.

A memory cell MC is comprised of one magneto-resistive element 11 and one diode 13. Write word lines WWL1, WWL2, ... and read word lines RWL1, RWL2, ... extend in the row direction, and bit lines BL1, bBL1, BL2, bBL2, ... extend in the column direction.

The write word lines WWL1, WWL2, ... have no nodes on the memory cell array and are arranged to run near the magneto-resistive elements 11. That is, in a write operation, the magnetization directions (parallel, anti-parallel) of the magneto-resistive elements 11 are changed by using the magnetic fields generated by currents flowing in the write word lines WWL1, WWL2, . . . and bit lines BL1, bBL1, BL2, bBL2, . . . .

The read word lines RWL1, RWL2, . . . are connected to the cathodes of the diodes 13 as elements of memory cells MC. In read operation, the diode 13 of the selected memory cell MC is forward-biased to supply a constant current to the magneto-resistive element 11 of the selected memory cell MC, and the potentials of the bit lines BL1, bBL1, BL2, bBL2, . . . are changed in accordance with the state of the magneto-resistive element 11.

In the third example, specific memory cells in a memory cell array are used as dummy cells to generate a reference potential Vref. For example, a specific one of a plurality of memory cells connected to one bit line is used as a dummy cell DUMMY.

Like the memory cell MC, a dummy cell DUMMY is comprised of one magneto-resistive element 11 and one diode 13. Dummy write word lines DWWL1, DWWL2, . . . and dummy read word lines DRWL1, DRWL2, . . . extend in the row direction. The bit lines BL1, bBL1, BL2, bBL2, . . . are commonly connected to memory cells MC and dummy cells DUMMY.

The dummy write word lines DWWL1, DWWL2, . . . have no nodes on the memory cell array and are arranged to run near the magneto-resistive elements 11 in the dummy cells DUMMY. That is, in a write operation, the magnetization directions (parallel, anti-parallel) of the magneto-resistive elements 11 in the dummy cells DUMMY are changed by using the magnetic fields generated by currents flowing in the dummy write word lines DWWL1, DWWL2, . . . and bit lines BL1, bBL1, BL2, bBL2, . . . .

The dummy read word lines DRWL1, DRWL2, . . . are connected to the cathodes of the diodes 13 as elements of memory cells MC. In read operation, the diode 13 of the selected dummy cell DUMMY is forward-biased to supply a constant current to the magneto-resistive element 11 of the selected dummy cell DUMMY, and the potentials of the bit lines BL1, bBL1, BL2, bBL2, . . . are changed in accordance with the state of the magneto-resistive element 11.

In this example, with regard to one (BLi) of each pair of bit lines BLi and bBLi, "0"-data are stored in the dummy cells DUMMY connected to odd-numbered bit lines BL1, . . . , and "1"-data are stored in the dummy cells DUMMY connected to the even-numbered bit lines BL2, . . . .

The odd-numbered bit lines BL1, . . . and even-numbered bit lines BL2, . . . are connected to each other through equalize circuits (short-circuiting N-channel MOS transistors) 26. More specifically, the bit lines BL1 and BL2 are connected to each other through a short-circuiting N-channel MOS transistor QN10. Likewise, other corresponding bit lines are connected to each other through additional short-circuiting N-channel MOS transistors.

The short-circuiting N-channel MOS transistor QN10 is controlled by a control signal EQL0.

With regard to the other bit line (bBLi) of each pair of bit lines BLi and bBLi, "0"-data are stored in the dummy cells DUMMY connected to the odd-numbered bit lines bBL1, . . . , and "1"-data are stored in the dummy cells DUMMY connected to the even-numbered bit lines bBL2, . . . .

The odd-numbered bit lines bBL1, . . . and even-numbered bit lines bBL2, . . . are connected to each other through the equalize circuits (short-circuiting N-channel MOS transistors) 26. More specifically, the bit lines ball and bBL2 are connected to each other through a short-circuiting N-channel MOS transistor QN11. Likewise, other corresponding bit lines are connected to each other through additional N-channel MOS transistors.

The short-circuiting N-channel MOS transistor QN11 is ON/OFF-controlled by a control signal EQL1.

Note that the relationship between the data stored in dummy cells DUMMY and the bit lines short-circuited to each other is not limited to the above relationship, and can be variously changed.

It is important that the bit lines BLi or bit lines bBLi be short-circuited to each other, and half of 2×n (n is a natural number) dummy cells DUMMY connected to 2×n bit lines that are short-circuited store "0"-data, and the remaining cells store "1"-data.

A precharge circuit 23 serves to precharge all the bit lines BLi and bBLi to a precharge potential VPC in a standby state. The level of the precharge potential VPC sets a predetermined value. However, in this case, the diode of non-selected cell cannot turn on in the read operation.

The value of the precharge potential VPC is determined in consideration of the breakdown voltage of a magneto-resistance element, the bias dependence of a magnetic resistance change ratio MR, the ON resistance of a MOS transistor, and the like so as to output a signal with the maximum level within a reliability range.

Only one sense amplifier (S/A) 24 is provided for one pair of bit lines BLi and bBLi (i=1, 2, . . . ).

In this example, the sense amplifier 24 is based on the differential sense scheme of supplying a constant current Is to the memory cell MC and detecting the potential difference produced between the pair of bit lines BLi and bBLi. In addition, the memory cell array uses the folded bit line scheme.

The memory cell array arrangement shown in FIG. 21 is an example. Obviously, the present invention can be magnetic random access memories having other memory cell array arrangements.

The sense amplifier 24 compares the potential of one of the pair of bit lines BLi and bBLi to which the selected memory cell MC is connected with the potential of the other of the pair of bit lines BLi and bBLi (reference potential Vref), and amplifies the difference.

In a read operation, a read word line enable signal RWLEN is set at "H" level. At this time, an N-channel MOS transistor QN4 is turned on, and an NMOS transistor QN5 is turned off. An output signal Vbias from the bias voltage generating circuit 21 is therefore transferred to the gate of a P-channel MOS transistor QP2.

The sense current Is flows in all the bit lines BL1, bBL1, BL2, bBL2, . . . , and the potentials of the bit lines BL1, bBL1, BL2, bBL2, . . . change in accordance with the data in the selected memory cell MC or the data in the selected dummy cell DUMMY.

Note that since the potentials of the bit lines to which the dummy cells DUMMY are connected are equalized by an equalize circuit 26, Vref (=(V0+V1)/2) is obtained.

Figure 22:
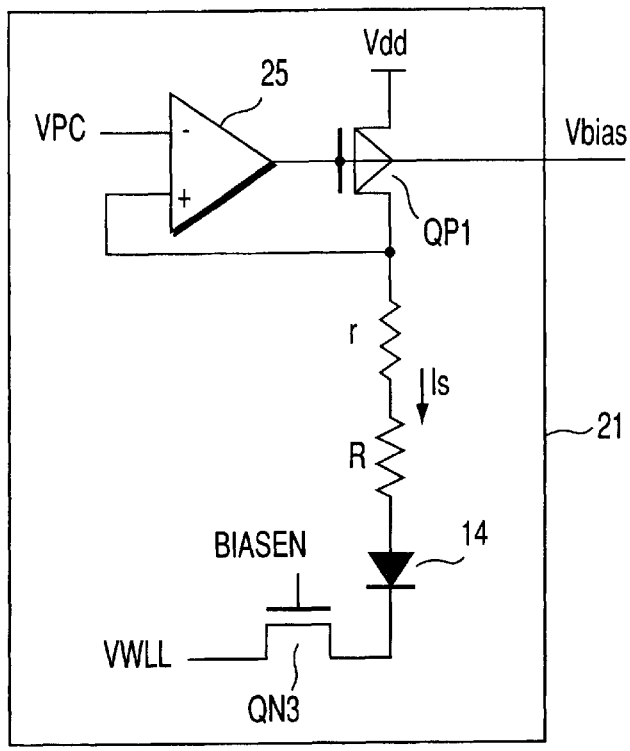
FIG. 22 is a circuit diagram showing an example of a bias voltage generating circuit.

FIG. 22 shows an example of the bias voltage generating circuit in FIG. 21.

As a magneto-resistance element R and diode 14, elements having the same layouts and sizes as those of the magneto-resistive element 11 and diode 13 in the memory cell MC or dummy cell DUMMY are used.

In the second embodiment, it is most preferable that the magneto-resistance element R be identical to, for example, the magneto-resistive element 11 in the memory cell MC.

However, the precision of the output signal Vbias from the bias voltage generating circuit 21 is not very significant, the magneto-resistance element may be replaced with another element.

The size of a P-channel MOS transistor QP1 having a gate to which the output signal Vbias from a differential amplifier 25 is input is substantially equal to that of the P-channel MOS transistor QP2 and a P-channel MOS transistor bQP2 of a sense current source 22 and an N-channel MOS transistor 12 of the memory cell MC.

The P-channel MOS transistor QP1 in the bias voltage generating circuit and the P-channel MOS transistors QP2 and bQP2 of the sense current source 22 constitute a current mirror circuit.

In a read operation, the sense current Is flows in the magneto-resistance element R in the bias voltage generating circuit 21 and also flows in one of the pair of bit lines BLi and bBLi (i=1, 2, . . . ) At this time, since interconnection resistances exist in the bit lines BLi and bBLi, the potentials of the bit lines drop. As a consequence, the potential differences among sense amplifier nodes N1, bN1, N2, bN2, . . . . change depending on the position of the selected memory cell MC.

If, for example, access is made to the memory cell MC nearest to the sense amplifier (S/A) 24, the influences of the interconnection resistances of the bit lines BLi and bBLi are minimized. If access is made to the memory cell MC located farthest from the sense amplifier (S/A) 24, the influence of the interconnection resistances of the bit lines BLi and bBLi is maximized.

The position of a selected memory cell, i.e., the potential differences among the sense amplifier nodes N1, bN1, N2, bN2, . . . due to the interconnection resistances of the bit lines BLi and bBLi become noise in sensing the data in the memory cell MC.

In order to reduce noise in such sense operation, according to the embodiment, as shown in FIG. 22, an adjusting resistor r having a resistance value ½ that of the interconnection resistance of the bit lines BLi and bBLi is connected between the P-channel MOS transistor QP1 and the magneto-resistance element R. The simplest method of forming the adjusting resistor r is to form an interconnection having a cross-sectional area equal to each of the bit lines BLi and bBLi and a length ½ that thereof by using the same interconnection layer as that for each of the bit lines BLi and bBLi.

If no row access is made, i.e., the read word lines RWL1, RWL2, . . . are not selected, and a current is supplied to the bias current generating circuit 21, the current is wasted. This interferes with a reduction in current consumption.

For this reason, a bias enable signal BIASEN is set at "H" level (e.g., a potential equal to the potential to be applied to the selected read word line) only for a period during which row access is made, and is set at "L" level (e.g., the ground potential) for other periods.

With this operation, an N-channel MOS transistor QN3 is kept on for only a period during which row access is made. This makes it possible to prevent a current from being wasted in the bias generating circuit, contributing to a reduction in current consumption.

A potential VWLL (an "L"-level potential to be applied to a read word line and dummy read word line) is applied to the source of the N-channel MOS transistor QN3. The N-channel MOS transistor QN3 has the same layout and size as those of a MOS transistor for applying the potential VWLL to a read word line RWLi and dummy read word line DRWLi.

Like a resistor r approximating the interconnection resistance of a bit line, a resistor r approximating the interconnection resistance of a word line may be connected between the P-channel MOS transistor QP1 and the N-channel MOS transistor QN3.

A sense operation in a read operation in the magnetic random access memory shown in FIGS. 21 and 22 will be described next with reference to the timing chart of FIG. 23.

For the sake of simplicity, assume that in the following description, the read word line RWL1 is selected, and the data in the memory cell MC is read out to the bit line BL1.

First of all, the bit lines BLi and bBLi are precharged before a sense operation. In a precharge operation, the precharge signal PC is set at "L" level (e.g., the ground potential), and hence all the pairs of bit lines BLi and bBLi are precharged to VPC.

At this time, the read word line RWL1 and dummy read word line DRWL2 are set at "H" level, i.e., a potential VWLH. Since the potential VWLH is higher than the potential Vref, the diodes 13 in the memory cell MC and dummy cell DUMMY are reverse-biased. Ideally, therefore, no current flows in the memory cell MC and dummy cell DUMMY.

When the precharge signal PC is set at "H" level (e.g., the internal power supply potential) afterward, the precharged states of the pair of bit lines BLi and bBLi are canceled.

When a read word line enable signal RWLEN is set at "H" level, the selected read word line RWL1 and selected dummy read word line DRWL2 are changed from "H" level to "L" level, i.e., from VWLH to VWLL, by the read word line driver.

As a consequence, the diode 13 in the memory cell MC connected to the selected read word line RWL1 and the diode 13 in the dummy cell DUMMY connected to the selected dummy read word line DRWL2 are forward-biased.

If the potential VWLH is higher than the bit line potential at the time of "1"-read operation, the diode 13 in the unselected memory cell MC or unselected dummy cell DUMMY is kept reverse-biased. Hence, no current flows in the memory cell MC and dummy cell DUMMY.

At the same time, the N-channel MOS transistor QN4 in FIG. 21 is turned on. As a consequence, the bias potential Vbias output from the bias voltage generating circuit 21 is transferred to the P-channel MOS transistor QP2, and the sense current Is flows in all the pairs of bit lines BL1, bBL1, BL2, bBL2, . . . by a current mirror.

Figure 23:
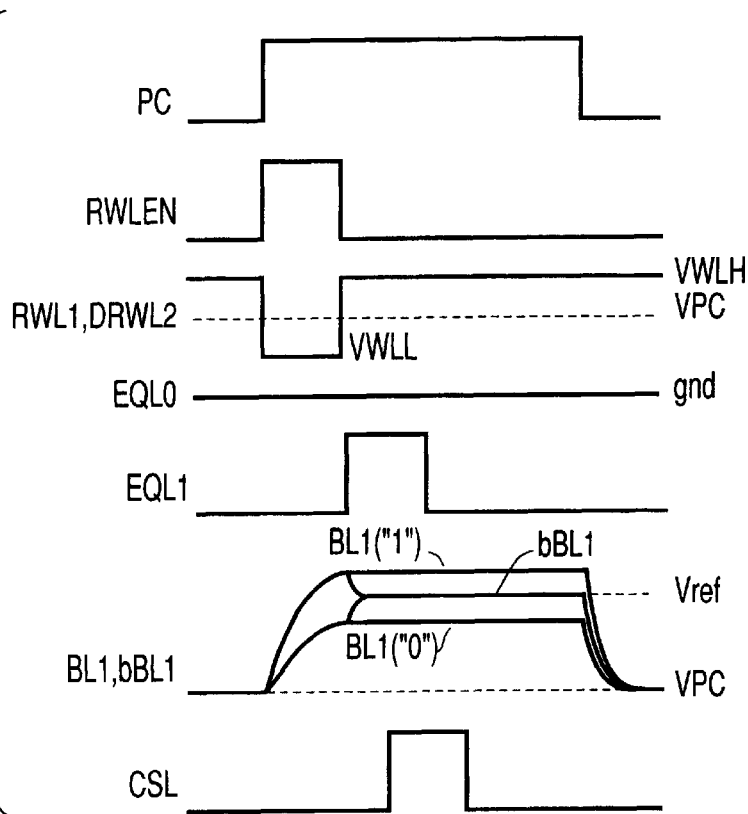
FIG. 23 is a timing chart showing the sense operation of the MRAM including the elements shown in FIGS. 21 to 22.

If, therefore, the data stored in the selected memory cell MC or dummy cell DUMMY is "0", the potential of the bit line BL1 is kept at the precharge potential VPC or slightly raised from the precharge potential VPC, as shown in FIG. 23. If the data stored in the selected memory cell MC or dummy cell DUMMY is "1", the potential of the bit line BL1 greatly rises from the precharge potential VPC.

Note that the dummy cells DUMMY are preferably arranged at the middle portions of the bit lines BL1, bBL1, BL2, bBL2, . . . to equalize noise due to the interconnection resistances (or potential drops) of the bit lines BL1, bBL1, BL2, bBL2, . . . .

In this example, since the read word line RWL1 and dummy read word line DRWL2 are selected, the potentials of the bit lines BL1, BL2, . . . change in accordance with the data stored in the memory cell MC, and the potentials of the bit lines bBL1, bBL2, . . . change in accordance with the data stored in the dummy cell DUMMY.

In this case, "0"-data is stored in the dummy cell DUMMY connected to the bit line bBL1, and "1"-data is stored in the dummy cell DUMMY connected to the bit line bBL2.

After the potential of each of the bit lines BL1, bBL1, BL2, bBL2, . . . sufficiently changes in accordance with the data stored in the memory cell MC or dummy cell DUMMY, the potential of the read word line enable signal RWLEN changes from "H" level to "L" level, and the potentials of the read word line RWL1 and dummy read word line DRWL2 also change from VWLL to VWLH.

As a result, the sense current Is flowing in each of the bit lines BL1, bBL1, BL2, bBL2, . . . stops, and each of the bit lines BL1, bBL1, BL2, bBL2, . . . is set in a floating state while holding a value corresponding to the data stored in the memory cell MC or dummy cell DUMMY.

The control signal EQL1 is then set at "H" level to turn on the N-channel MOS transistor QN11 in the equalize circuit 26, thereby short-circuiting the bit lines bBL1 and bBL2 to which the data in the selected dummy cell DUMMY is output. As a consequence, charge is shared between the two bit lines bBL1 and bBL2, and both the potentials of the bit lines bBL1 and bBL2 become an optimal intermediate potential (=(V0+V1)/2) as a reference potential.

More specifically, the "0"-data stored in the dummy cell DUMMY is output to the bit line bBL1 to set the bit line at V0 and the "1"-data stored in the dummy cell DUMMY is output to the bit line bBL2 to set the bit line at V1. By setting the control signal EQL1 at "H" level, therefore, both the potentials of the bit lines bBL1 and bBL2 are set at an intermediate potential (=(V0+V1)/2).

Charge sharing operation is performed by the equalize circuit 26 while the sense current Is flowing in the bit lines BL1, bBL1, BL2, bBL2, . . . is interrupted, and the bit lines BL1, bBL1, BL2, bBL2, . . . are set in a floating state to trap the data in the bit. lines BL1, bBL1, BL2, bBL2, . . . . Therefore, the reference potential Vref to be generated does not vary regardless of the equalizing timing.

After the reference potential Vref is generated at each of the bit lines bBL1, bBL2, . . . , the potential difference between the pair of bit lines BL1 and bBL1 can be transferred as the difference between currents flowing in the pair of data lines (the pair of DQ lines) DQ and bDQ through the sense amplifiers 24 by setting a column select signal CSL at "H" level.

When sense amplifiers based on the direct sense scheme are to be used, a circuit for directly sensing the current difference between the pair of data lines DQ and bDQ or a circuit for converting this current difference into a potential difference again and sensing a voltage must be connected to the pair of data lines DQ and bDQ.

Finally, the precharge signal PC is set at "L" level again to set all the bit lines BL1, bBL1, BL2, bBL2, . . . to the precharge potential VPC to prepare for the next read cycle.

In the above sense operation, restore operation like that performed in a DRAM is not performed for the following reason. Since a magnetic random access memory (MRAM) is capable of a nondestructive data read, the data need not be rewritten in the memory cell. Therefore, the potentials of the pair of bit lines BL1 and bBL1 need not go full swing for data restore operation.

In addition, since the potentials of the pair of bit lines BL1 and bBL1 need not go full swing after data sensing, the amount of charge required for charging/discharging of the pair of bit lines BL1 and bBL1 decreases, contributing to a reduction in power consumption. In addition, since this can prevent a high voltage from being applied to a magneto-resistance element (TMR element), the reliability of the magneto-resistance element can be improved.

Furthermore, since no restore operation is required, after the data in the memory cell MC is sufficiently output to the bit line BL1, the potentials of the selected read word line RWL1 and selected dummy read word line DRWL2 can be quickly dropped from "H" level to "L" level.

That is, since the potential level of the read word line RWL1 and dummy read word line DRWL2 need not be raised for data restore operation, the potential level of the read word line RWL1 and dummy read word line DRWL2 can be lowered to stop the sense current Is flowing in the bit line BL1 immediately after the data is output to the bit line BL1. This makes it possible to eliminate the waste of power and attain a reduction in power consumption.

As described above, in magnetic random access memory (MRAM), since nondestructive read operation is performed, no restore operation is required, and the potentials of a pair of bit lines need not go full swing. The bit lines and the sense amplifiers can be precharged independently. Therefore, as for read operation, the magnetic random access memory can realize high-speed random access with low power consumption as compared with the DRAM.

SUMMARY

According to the second embodiment, the intermediate potential (V0+V1)/2 most suitable for the reference potential Vref is obtained by supplying sense currents to memory cells respectively storing "0"-data and "1"-data, which are specific memory cells (dummy cells) in a memory cell array, and synthesizing the resultant potentials V0 and V1.

A sense operation can therefore be accurately performed, contributing to an improvement in reliability. In addition, a read operation can be performed in the same manner as a DRAM. If, therefore, an MRAM is to be developed as a substitute for a DRAM, compatibility with the DRAM can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a memory cell including a magneto-resistance element having two resistance values;
    a bit line as a first current pass connected to said memory cell;
    a sense current source connected to said bit line;
    a sense amplifier connected to said bit line; and
    a bias voltage generating circuit having a reference cell as a second current pass, wherein the first and second current passes are connected to each other by a current mirror circuit, and said reference cell has a resistance value of a substantially center of the two resistance values of said magneto-resistance element.

2. The memory according to claim 1, wherein said reference cell includes a structure corresponding to a structure of said memory cell.

3. The memory according to claim 1, wherein said reference cell comprises a first element constituted by two parallel-connected magneto-resistance elements whose magnetization directions are parallel, and a second element constituted by two parallel-connected magneto-resistance elements whose magnetization directions are anti-parallel, said first and second elements being connected in series.

4. The memory according to claim 1, further comprising a first switch element connected to said magneto-resistance element in series, and a second switch element connected to said reference cell in series.

5. The memory according to claim 4, wherein said first and second switch elements respectively comprise MOS transistors ON/OFF-controlled by gate potentials.

6. The memory according to claim 4, wherein said first and second switch elements respectively comprise diodes ON/OFF-controlled by cathode potentials.

7. The memory according to claim 4, further comprising an adjusting resistor connected to said reference cell in series, said adjusting resistor having a resistance value substantially half that of said bit line.

8. The memory according to claim 1, further comprising a precharge circuit connected to said bit line.

9. A magnetic random access memory comprising:
   a memory cell including a magneto-resistance element having two resistance values;
   a bit line connected to said memory cell;
   a first MOS transistor connected to said bit line;
   a sense amplifier connected to said bit line; and
   a bias voltage generating circuit having a reference cell and a second MOS transistor connected in series, wherein the first and second MOS transistors comprise a current mirror circuit, and wherein said reference cell has a resistance value of a substantially center of the two resistance values of said magneto-resistance element.

10. The memory according to claim 9, wherein said reference cell includes a structure corresponding to a structure of said memory cell.

11. The memory according to claim 9, wherein said reference cell comprises a first element constituted by two parallel-connected magneto-resistance elements whose magnetization directions are parallel, and a second element constituted by two parallel-connected magneto-resistance elements whose magnetization directions are anti-parallel, said first and second elements being connected in series.

12. The memory according to claim 9, further comprising a first switch element connected to said magneto-resistance element in series, and a second switch element connected to said reference cell in series.

13. The memory according to claim 9, wherein said first and second switch elements respectively comprise MOS transistors ON/OFF-controlled by gate potentials.

14. The memory according to claim 9, wherein said first and second switch elements respectively comprise diodes ON/OFF-controlled by cathode potentials.

15. The memory according to claim 12, further comprising an adjusting resistor connected to said reference cell in series, said adjusting resistor having a resistance value substantially half that of said bit line.

16. The memory according to claim 9, further comprising a precharge circuit connected to said bit line.

17. A magnetic random access memory comprising:
    a first memory cell including a first magneto-resistance element having two resistance values;
    a second memory cell including a second magneto-resistance element having two resistance values;
    a first bit line pair having first and second bit lines, wherein the first bit line is connected to said first memory cell;
    a second bit line pair having third and fourth bit lines, wherein the third bit line is connected to said second memory cell;
    a first sense amplifier connected to said first bit line pair;
    a second sense amplifier connected to said second bit line pair;
    a sense current source connected to said first and second bit line pairs;
    an equalize circuit connected between said second bit line and said fourth bit line, wherein the second and fourth bit lines are electrically connected by said equalize circuit;
    a first dummy cell, having a first resistance value, connected to said second bit line; and
    a second dummy cell, having a second resistance value different from the first resistance value, connected to said fourth bit line.

18. The memory according to claim 17, wherein said equalize circuit electrically connects said second bit line and said fourth bit line in a read mode.

19. The memory according to claim 17, wherein said first sense amplifier compares potentials of said first bit line and said second bit line, and said second sense amplifier compares potentials of said third bit line and said fourth bit line.

20. The memory according to claim 17, further comprising an isolate circuit configured to isolate said first and second sense amplifiers from the first, second, third and fourth bit lines while the second and fourth bit lines are electrically connected.

21. The memory according to claim 17, further comprising a first switch element connected to said first magneto-resistance element in series, and a second switch element connected to said second magneto-resistance element in series.

22. The memory according to claim 21, wherein first and second switch elements respectively comprise MOS transistors ON/OFF-controlled by gate potentials.

23. The memory according to claim 21, wherein said first and second switch elements respectively comprise diodes ON/OFF-controlled by cathode potentials.

24. The memory according to claim 17, further comprising a precharge circuit connected to said first, second, third, and fourth bit lines.

25. A memory according to claim 17, wherein said first bit line pair is adjacent to said second bit line pair.

* * * * *

UNITED STATES PATENT AND TRADEMARK OFFICE
CERTIFICATE OF CORRECTION

PATENT NO. : 6,504,752 B2
DATED : January 7, 2003
INVENTOR(S) : Hiroshi Ito

It is certified that error appears in the above-identified patent and that said Letters Patent is hereby corrected as shown below:

<u>Column 37,</u>
Line 47, "claim 9" has been replaced with -- claim 12 --;
Line 50, "claim 9" has been replaced with -- claim 12 --.

Signed and Sealed this

Twenty-ninth Day of July, 2003

JAMES E. ROGAN
*Director of the United States Patent and Trademark Office*